United States Patent
Matsushima et al.

(10) Patent No.: US 7,633,265 B2
(45) Date of Patent: Dec. 15, 2009

(54) SECONDARY-BATTERY MANAGEMENT APPARATUSES, SECONDARY-BATTERY MANAGEMENT METHOD, AND SECONDARY-BATTERY MANAGEMENT PROGRAM

(75) Inventors: Toshio Matsushima, Tokyo (JP); Nobuhiko Susuki, Tokyo (JP); Hiroshi Wakaki, Tokyo (JP)

(73) Assignee: NTT Facilities, Inc., Tokyo (JP)

( * ) Notice: Subject to any disclaimer, the term of this patent is extended or adjusted under 35 U.S.C. 154(b) by 246 days.

(21) Appl. No.: 11/645,585

(22) Filed: Dec. 27, 2006

(65) Prior Publication Data

US 2007/0145949 A1 Jun. 28, 2007

(30) Foreign Application Priority Data

Dec. 28, 2005 (JP) .............................. 2005-380319

(51) Int. Cl.
  *H02J 7/00* (2006.01)
  *H02J 7/04* (2006.01)
  *G01N 27/416* (2006.01)
  *G08B 27/00* (2006.01)

(52) U.S. Cl. ................. 320/134; 320/149; 320/155; 320/133; 324/426; 340/636.1; 340/636.21

(58) Field of Classification Search ................. 320/138, 320/132, 133, 134, 149, 155
See application file for complete search history.

(56) References Cited

U.S. PATENT DOCUMENTS 5,936,383 A * 8/1999 Ng et al. ..................... 320/132

2005/0029988 A1* 2/2005 Tran .......................... 320/132

FOREIGN PATENT DOCUMENTS

JP 2004-64978 A 2/2004

OTHER PUBLICATIONS

K. Takeno et al., "Method of Energy Conservation and Management for Commercial Li-ion Battery Packs of Mobile Phones", IEICE/IEEE, INTELEC' 03, Oct. 19-23, 2003, 15-1, pp. 310-316, Japan (2003).
K. Takahashi et al., "Development of SOH Monitoring System for Industrial VRLA Battery String", IEICE/IEEE, INTELEC' 03, Oct. 19-23, 2003, 35-1, pp. 664-670, Japan (2003).

(Continued)

*Primary Examiner*—Edward Tso
*Assistant Examiner*—Yalkew Fantu
(74) *Attorney, Agent, or Firm*—Rader, Fishman & Grauer, PLLC

(57) ABSTRACT

A secondary-battery management apparatus calculates the possible discharge duration of a secondary battery correctly even after a load current changes. The secondary-battery management apparatus calculates the remaining capacity and the remaining lifetime of the secondary battery in accordance with a measured temperature of the battery in a standby state, calculates the remaining capacity of the battery in accordance with a measured discharging current of the battery while the battery is in a discharging state, and calculates the remaining capacity of the battery in accordance with a measured charging current while the battery is in a charging state. When discharging from the battery is required by means of a reduction of an output voltage of a rectifier, the deterioration of the battery is checked by discharging to a load device. A battery capacity is checked by measuring the discharge duration of the battery in the discharge by the load current pattern.

19 Claims, 23 Drawing Sheets

OTHER PUBLICATIONS

T. Fukunaga et al., "Development of Lithium-ion Battery for Electric Vehicle—Challenge to 2000km/24 hours Driving -", GS News Technical Report, vol. 59, No. 2, pp. 23-28, Japan (Dec. 2000).

J. Yamagi et al, "2001 Battery Technology Symposium", JMA Techno-Frontier Week 2001, Japan Management Association, Session 4, p. 4-2-1-p. 4-2-9, Japan (2001).

* cited by examiner

SENSING: RECTIFIER OUTPUT VOLTAGE
LOAD CURRENT
BATTERY VOLTAGE

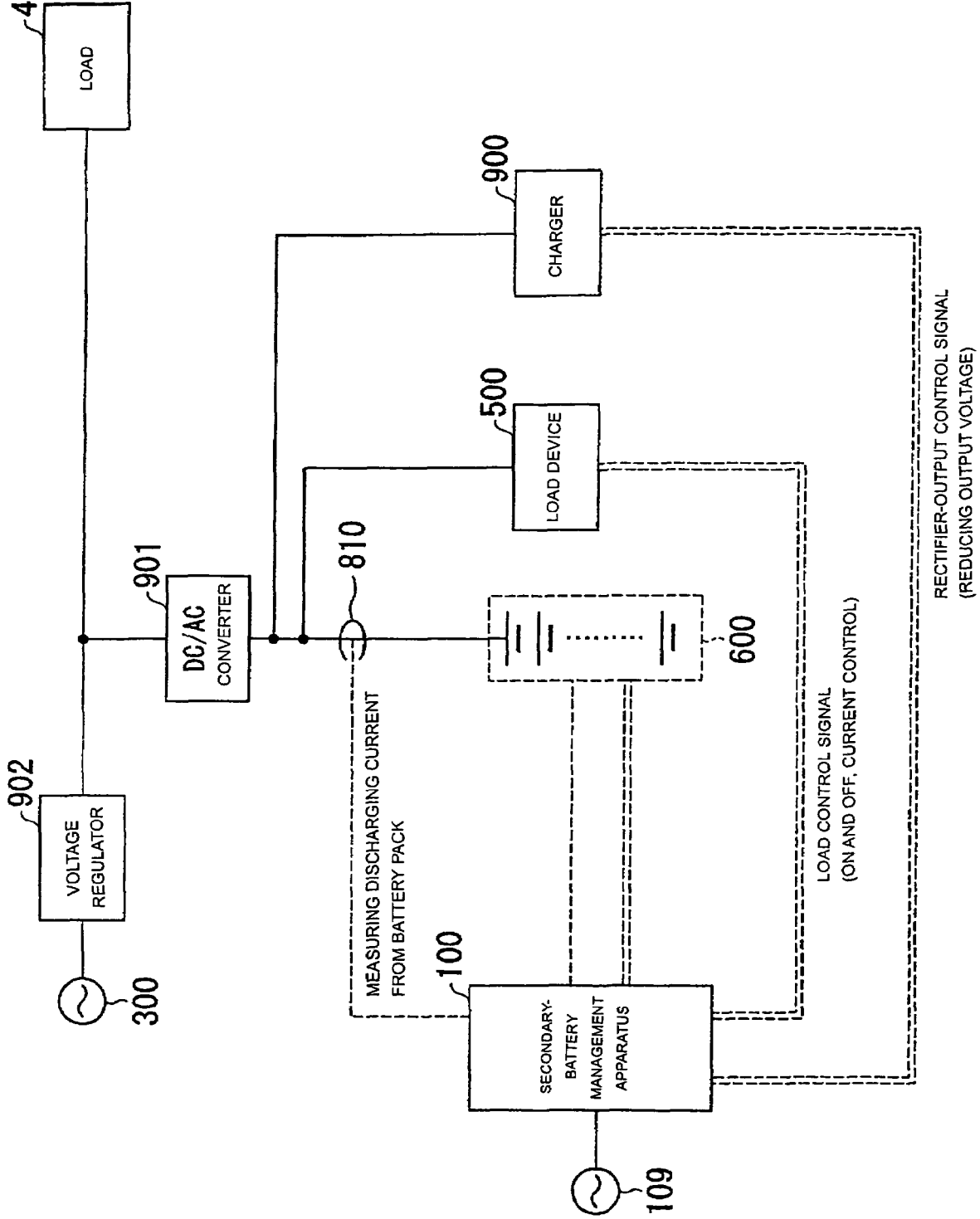

US 7,633,265 B2

SECONDARY-BATTERY MANAGEMENT APPARATUSES, SECONDARY-BATTERY MANAGEMENT METHOD, AND SECONDARY-BATTERY MANAGEMENT PROGRAM

CROSS-REFERENCES TO RELATED APPLICATION

This application claims priority from Japanese Patent Application Serial No. 2005-380319 filed on Dec. 28, 2005, the contents of which are incorporated herein by reference in its entirety.

TECHNICAL FIELD

Described herein is a secondary-battery management apparatus, a secondary-battery management method, and a secondary-battery management program for a secondary battery, such as, a lithium-ion battery, in a power supply system using the secondary battery as a backup power supply, more specifically, a secondary-battery management apparatus, a secondary-battery management method, and a secondary-battery management program, for managing the state of a battery pack containing lithium-ion batteries, used as a backup power supply in a communication device and communication application.

BACKGROUND

Conventionally, in a communication power supply or emergency power supply, a secondary battery is used as a backup power supply, and in most cases, a lead-acid storage battery has been used as the secondary battery provided for this purpose. Such a lead-acid storage battery has been used for years, in which stable performance is maintained even after extended period of use thereof, so that it is highly reliable. Further, such a lead-acid storage battery can be produced so as to have a large capacity, such as thousands of ampere-hours (Ah), although the output voltage is as low as 2 V. The battery can be changed merely by connecting it to a charger, without providing a special battery protector. A rise in voltage can be prevented by using a water-based electrolytic solution. In particular, when the water-based electrolytic solution is used, electrolysis of the water may start after the charging of the battery is completed, even if the battery is overcharged because of a failure in a rectifier. Accordingly, the maximum value of the terminal voltage is suppressed to the voltage of the electrolysis (about 3 V) or less, and this safety feature prevents a further voltage rise.

The lead-acid storage battery used in power supply systems has features of usability. However, because the battery is composed of mostly an electrode material, which is a lead-based material, the weight and volume of the battery per unit energy are large. Therefore, in order to store the same energy in a lead-acid storage battery, the volume and weight of the battery becomes larger than the others. These problems can be solved by using a secondary battery having less weight and volume per unit energy, or having a greater discharging energy per unit weight or volume.

A secondary battery having a high energy density is a lithium-ion battery. In the lithium-ion battery a lithium and metallic oxide compound is used for the cathode and a carbon-based material is used for the anode. Lithium ions liberated from the cathode and moving between the cathode and the anode causes reactions in a charge and discharge. Lithium ions are taken into the carbon during charging, and during discharging, the lithium ions move to the oxide in the cathode and enter the cathode.

Because of its high energy density, the lithium-ion battery largely contributes to reduction of the size and weight of the system and has widely used in mobile telephone terminals, personal computers, and the like. In such a small apparatus since an operating voltage is low and an output voltage operated at the lithium-ion battery is about 4 V, about one to three lithium-ion batteries connected in series may operate such an apparatus. Thus the lithium-ion batteries are thus useful in reducing the size of the system. Unlike lead-acid storage batteries, in such a lithium-ion batteries, an electrolytic solution whose main component is an organic liquid is used, and therefore, a function for suppressing a rise of terminal voltage during charging does not work. Accordingly, the terminal voltage must be monitored during charging, and a certain measure to prevent the voltage rise must be provided. Discharging must be stopped when the terminal voltage decreases to a predetermined level. This is because copper used as a conductive material serving as an electricity path from the electrode to a load (at the anode) starts liberating ions at the above-mentioned or less voltage. The liberated copper ions become impurities that interfere with the reaction of the battery.

When a battery like a lithium-ion battery is used, the voltage must be monitored to control charging and discharging. The temperature must also be monitored, and some measures, such as stopping the charging of the battery, must be taken when the temperature reaches a certain level. Conventionally, in a mobile phone, charging the lithium-ion battery is controlled in accordance with a monitored temperature or the like (for instance, refer to Kazuhiko Takeno, et al. "Methods of Energy Conservation and Management for Commercial Li-ion Battery Packs of Mobile Phones," Proceedings of INTELE03, 15-1, p. 310). A special chip for controlling the charging of a lithium-ion battery has also been developed (refer to Symposium on Battery Technology, 2001, 4-2-1, Japan Management Association, for instance).

A battery like a 100 Ah lithium-ion battery for use in electric vehicle has been developed in recent years. A battery pack containing lithium-ion batteries is used with a charging control circuit, thereby controlling charging and discharging or monitoring each cell voltage (refer to GS News Technical Report, Vol. 59, No. 2, p. 23, 2000). As the batteries for use in an electric vehicle are charged and discharged repeatedly, just charge control and discharge management are performed.

Batteries like lithium-ion batteries for use as a backup in a general-purpose power supply have also been produced in recent years. The backup secondary battery in a DC power supply system for supplying power directly to a communication equipment such as a telephone switching is maintained by a floating charge method, and a load device and the secondary battery are connected in parallel on the output side of a rectifier. The rectifier always supplies DC power to the load and supplies a charging current needed to maintain the battery in a fully charged state, in accordance with the charging state of the secondary battery. In this system, the secondary battery discharges in case that any power failure or failure of the rectifier occurs, and the power supply to the load device will thus never be interrupted. This is because the capacity of the secondary battery is selected so that necessary power can be supplied by discharging the secondary battery during a period when the DC power supply system needs the power.

In such a system, in which a high reliability is required when operated with a backup power supply, in order to determine the status of the secondary battery, such as the remaining operatable life span (measured in years), the remaining capacity, and the like, may be used in addition to the controlling charging and discharging. A communication power supply system has a remote monitoring unit for a sealed lead-acid storage battery used as a backup power supply, which measures the internal resistance and the terminal voltage of the secondary battery (refer to Kiyoshi Takahashi and Yuichi Watakabe, "Development of SOH Monitoring System for Industrial VRLA Battery String," Proceedings of INTELECO3, 35-1, p. 664, for instance).

In one method of keeping track of the status of the backup secondary battery, the power supply system lowers the output voltage of the rectifier for a predetermined period of time while power is being supplied, thereby causing the secondary battery to discharge, in order to check whether the secondary battery supplies normal power (refer to Kazuhiko Takeno, et al., the voltage characteristics based on "Methods of Energy Conservation and Management for Commercial Li-ion Battery Packs of Mobile Phones," Proceedings of INTELE03, 15-1, p. 310).

In addition, a power converter is known in which its reliability is improved by allowing a single user board to back up power upon a power failure (by supplying a voltage from a lithium battery to a DC-DC module), and the front-end section can be made smaller and lighter (disclosed in Japanese Unexamined Patent Application Publication No. 2004-64978 (Abstract and FIG. 1)).

SUMMARY

For example, battery like a lithium-ion battery has been rarely used as a backup power supply, and a management apparatus for the lithium-ion battery has not been developed. It should be judged whether the secondary battery can fully carry out the intended performance by monitoring the remaining capacity of the secondary battery, so that the status of the system may be checked. However, a suitable method has not yet been proposed nor implemented.

When a power supply system uses a lithium-ion battery as a backup power supply, a management system has been required to control charging and discharging and to keep track of the remaining operatable life span (measured in years), the remaining capacity, and the like of the secondary battery.

Because a battery like a lithium-ion battery has been rarely used as a backup power supply, a special management apparatus for the lithium-ion batteries has not yet been developed. When a battery pack containing lithium-ion batteries is incorporated in a backup power supply, it is difficult to manage the battery because the daily battery status cannot be managed and because the remaining capacity of the battery cannot be checked during discharging or recharging.

A method of causing the secondary battery to discharge by lowering an output voltage of the rectifier for a predetermined period has been conventionally used for the purpose of checking whether the secondary-battery charge-discharge circuit is operating normally, but in this method the remaining capacity of the secondary battery can not be obtained.

The main reasons for this are that when the battery discharges directly through an actual load, the discharging current is not ensured to have a constant value, and even if the discharging current is kept to a constant level, the relationship between the voltage characteristics and the remaining capacity of the secondary battery are generally not known.

Even if the capacity of the secondary battery is calculated by a conventional method, the actual load current may differ from the current value obtained when the capacity is calculated. If the load current in an actual operation becomes greater than expected, a desired discharge duration cannot be maintained in the actual operation, thereby making it impossible for the backup power supply to serve its purpose.

In view of the circumstances described above, provided is a secondary-battery management apparatus, a secondary-battery management method, and a secondary-battery management program that can manage a secondary battery used as a backup power supply, such as a lithium-ion battery, that can calculate an accurate possible discharge duration of the secondary battery even if the load current varies, and that can issue an alarm before it becomes impossible to ensure a desired discharge duration because of a higher-than-expected load current.

The secondary-battery management apparatus in a power supply system includes a secondary battery as a backup power supply and supplies power to a load. The secondary-battery management apparatus includes a load device provided separately from the load and connected in parallel to the load; a battery-data storage section for storing a load current pattern of current flowing through the load and a maximum current, which is the maximum value of current flowing through the load; a measurement-conditions input section for obtaining the time to discharge the secondary battery because of a reduction in output of a rectifier and the time to check the capacity of the secondary battery by using the load current pattern; an arithmetic section for calculating the remaining capacity and the remaining lifetime of the secondary battery in accordance with information on a measured value of temperature of the secondary battery in a standby state, in which the secondary battery is not charging nor discharging, for calculating the remaining capacity of the secondary battery in accordance with information on a measured value of discharging current from the secondary battery while the secondary battery is in a discharging state, and for calculating the remaining capacity of the secondary battery in accordance with information on a measured value of charging current to the secondary battery while the secondary battery is in a charging state; a first control section for judging the reduced capacity of the secondary battery by supplying the load current stored in the battery-data storage section to the load device when the time to discharge the secondary battery because of a reduction in output of the rectifier has come, the time being obtained by the measurement-conditions input section; and a second control section for calculating the discharge duration of the secondary battery by using the load current pattern stored in the battery-data storage section when the time to check the battery capacity by using the load current pattern has come, the time being obtained by the measurement-conditions input section.

The secondary-battery management apparatus may further include a temperature measurement section for measuring the temperature of the secondary battery; a voltage measurement section for measuring the voltage of the secondary battery; and a third control section for stopping charging or discharging of the secondary battery when the temperature measured by the temperature measurement section exceeds a predetermined level or when the voltage measured by the voltage measurement section exceeds a predetermined level.

The secondary-battery management apparatus may further includes a first correction means for correcting the possible discharge duration of the secondary battery in accordance with changes of the secondary battery over time.

The secondary-battery management apparatus may further includes a second correction means for correcting the possible discharge duration in accordance with the ambient temperature of the secondary battery.

The secondary-battery management apparatus may further includes an alarm output means for outputting an alarm when the possible discharging time of the secondary battery is shorter than a predetermined period.

The above object is achieved in another aspect of the present invention through the provision of a secondary-battery management method for managing a secondary battery, including the steps of storing a load current pattern of current flowing through a load and a maximum current, which is the maximum value of current flowing through the load; obtaining the time to discharge the secondary battery because of a reduction in output of a rectifier and the time to check the secondary battery capacity by using the load current pattern; calculating the remaining capacity and the remaining lifetime of the secondary battery in accordance with information on a measured value of temperature of the secondary battery in a standby state, in which the secondary battery is not charging or discharging, calculating the remaining capacity of the secondary battery in accordance with information on a measured value of discharging current from the secondary battery while the secondary battery is in a discharging state, and calculating the remaining capacity of the secondary battery in accordance with information on a measured value of charging current to the secondary battery while the secondary battery is in a charging state; judging the reduced capacity of the secondary battery by supplying the load current to a load device when the time to discharge the secondary battery because of a reduction in output of the rectifier has come; and calculating the discharge duration of the secondary battery by using the load current pattern when the time to check the capacity of the secondary battery by using the load current pattern has come.

The secondary-battery management method may further include the steps of measuring the temperature of the secondary battery; measuring the voltage of the secondary battery; and stopping the charging or discharging of the secondary battery when the temperature exceeds a predetermined level or when the voltage exceeds a predetermined level.

The secondary-battery management method may further includes the step of correcting the possible discharge duration of the secondary battery in accordance with changes of the secondary battery over time.

The secondary-battery management method may further includes the step of correcting the possible discharge duration in accordance with the ambient temperature of the secondary battery.

The secondary-battery management method may further includes the step of outputting an alarm when the possible discharging time of the secondary battery is shorter than a predetermined period.

The above object is achieved in another aspect of the present invention through the provision of a computer program for managing a secondary battery, the computer program causing a computer to execute a first step of storing a load current pattern of current flowing through a load and a maximum current, which is the maximum value of current flowing through the load; a second step of obtaining the time to discharge the secondary battery because of a reduction in output of a rectifier and the time to check the capacity of the secondary battery by using the load current pattern; a third step of calculating the remaining capacity and the remaining lifetime of the secondary battery in accordance with information on a measured value of temperature of the secondary battery in a standby state, in which the secondary battery is not charging or discharging, calculating the remaining capacity of the secondary battery in accordance with information on a measured value of discharging current from the secondary battery while the secondary battery is in a discharging state, and calculating the remaining capacity of the secondary battery in accordance with information on a measured value of charging current to the secondary battery while the secondary battery is in a charging state; a fourth step of judging the reduced capacity of the secondary battery by supplying the load current to a load device when the time to discharge the secondary battery because of a reduction in output of the rectifier has come; and a fifth step of calculating the discharge duration of the secondary battery by using the load current pattern when the time to check the secondary battery capacity by using the load current pattern has come.

BRIEF DESCRIPTION OF THE DRAWINGS

Other features and advantages of the present apparatus, method, and program will be apparent from the ensuing description, taken in conjunction with the accompanying drawings, in which:

FIG. 30 is an outlined block diagram showing another example of the application of a secondary-battery management apparatus to an AC power supply apparatus.

DETAILED DESCRIPTION

Figure 1:
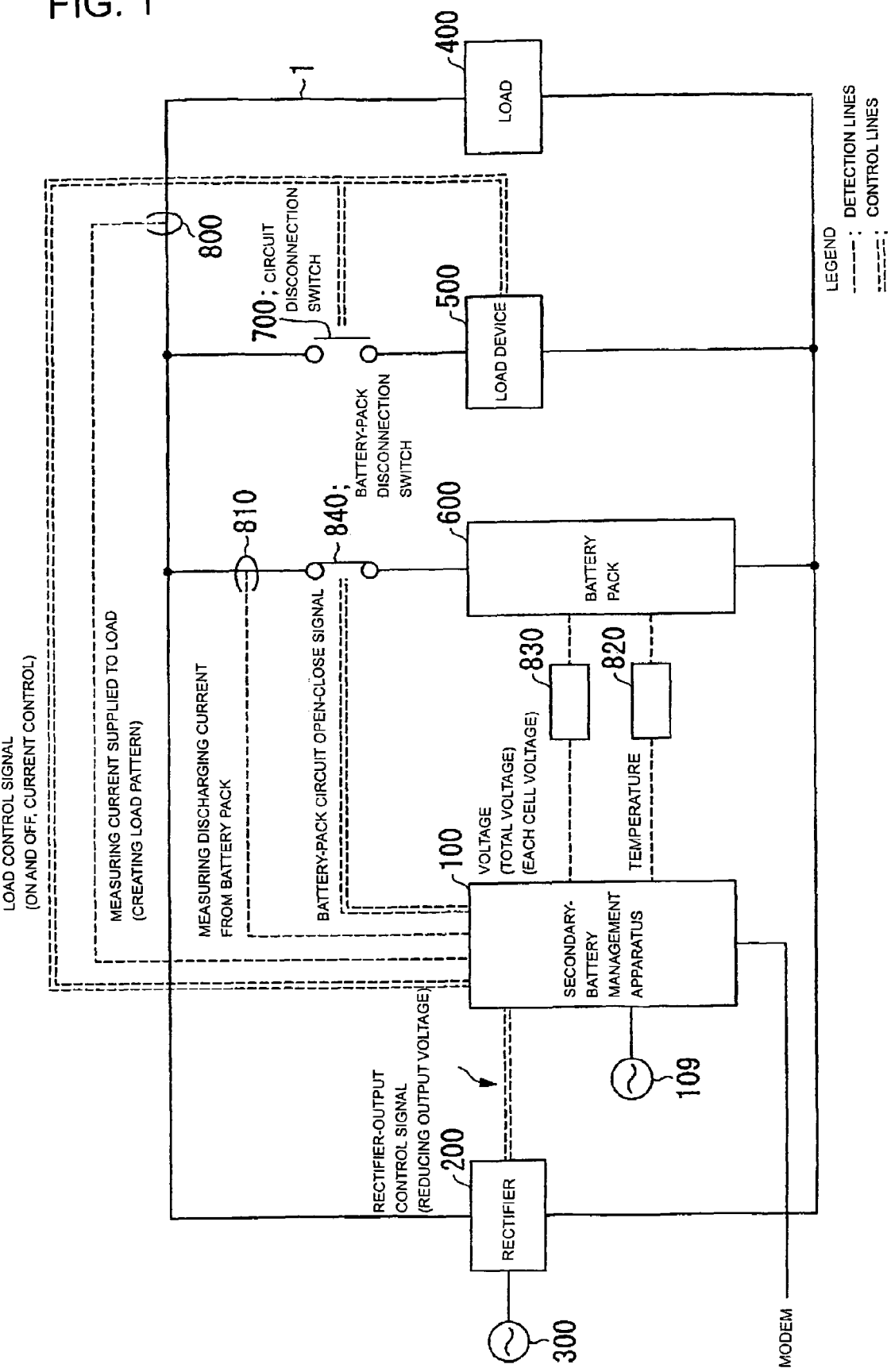
FIG. 1 is a schematic block diagram showing the structure of a DC power supply apparatus employing a secondary-battery management apparatus according to an embodiment.

While the claims are not limited to the illustrated embodiments, an appreciation of various aspects of the present apparatus, method, and program is best gained through a discussion of various examples thereof.

An embodiment of the present invention will be described below with reference to the drawings. In the embodiment, as an example, a lithium-ion battery is used as a secondary battery.

A management apparatus according to the embodiment is a secondary-battery management apparatus for a battery like a lithium-ion battery. When the lithium-ion battery is not being charged or discharged, that is, in a standby state, the management apparatus performs operations set forth bellow.

(1) The apparatus calculates the remaining capacity and the remaining lifetime from a value of measured temperature of the lithium-ion battery.

(2) It measures values as to the voltage characteristics by performing short-time discharging and estimates the remaining capacity from the obtained voltage characteristics.

(3) It creates a load current pattern of the system by measuring the load current and estimates the discharge duration of the lithium-ion battery.

While the lithium-ion battery is discharging, the management apparatus calculates the remaining capacity from a measured value of discharging current of the lithium-ion battery. While the battery is recharging after the end of discharging, the management apparatus calculates the remaining capacity from a measured value of charging current of the lithium-ion battery. In these ways, the battery status, such as the remaining capacity and the remaining lifetime of the lithium-ion battery, is comprehensively checked.

In the operation (2), the secondary battery is discharged at a given time, at a given current, for a given period, and the deteriorated (reduced) capacity of the secondary battery is estimated from the discharge characteristics. The secondary battery is discharged while power is being supplied to the load device, so that, in this the embodiment, the output voltage of the operating rectifier is lowered to a specified value which falls within the voltage range permitted by the load, thereby causing discharge of the secondary battery. In this state, the discharging current of the secondary battery is kept at the current value required by the load. By providing a load device, in this embodiment, the current is adjusted so that discharge of the secondary battery may be caused at a given constant current. Then, the discharging current can be kept constant, and data of so-called constant-current discharge characteristics can be obtained. Since the deteriorated capacity can be shown in a time-dependent voltage curve during constant-current discharging, the terminal voltage of the target battery is measured at a given elapsed time. The capacity of the target battery is estimated from the measured value of the terminal voltage by referring to battery data obtained in advance, indicating the relationship between the deteriorated capacity and the terminal voltage of the secondary battery.

In the operation (3), in this embodiment a load current is measured by a load-current measurement section in the power supply system having a secondary battery (in this case, a lithium-ion battery) as a backup power supply in the standby state, or while the lithium-ion battery is not being charged or discharged, a load current pattern based on the load current and the period which is measured at the same time being created, the amount of electricity per unit is calculated and the value being substituted successively from the capacity of the battery to calculate the available discharge duration of the secondary battery.

In the embodiment, it is checked whether the calculated available discharge duration agrees with the discharge duration stored in a storage section. If it is predicted that a desired discharge duration cannot be ensured because of a load current higher than expected, a warning means issues an alarm.

The secondary-battery management apparatus according to the embodiment will be explained below.

FIG. 1 is a schematic block diagram of a DC power supply apparatus 1 to which a secondary-battery management apparatus 100 according to the embodiment is applied.

The figure shows an example of the structure of a so-called floating charge method, in which a battery pack 600 containing lithium-ion batteries (which form a secondary battery) and a load 400 are connected in parallel to the output of a charger (rectifier 200). In a trickle charge method, the battery pack 600 which is a secondary battery is not connected to the load 400 but is charged and maintained independently. The two methods have a common basic idea related to battery management.

The DC power supply apparatus 1 includes a secondary-battery management apparatus 100, an AC power supply 109, the rectifier 200, an AC power supply 300, the load 400, a load device 500, the battery pack 600, a circuit disconnection switch 700, a load current sensor 800, a battery-pack charging-and-discharging current sensor 810, a temperature sensor 820, a voltage sensor 830, and a battery-pack disconnection switch 840.

AC power supplied from the AC power supply 300 is converted to DC power by the rectifier 200, so that the DC power is supplied to the battery pack 600 and the load 400. The battery pack 600 which is composed of a plurality of the lithium-ion secondary batteries connected in series to each other, is connected to the rectifier 200 and the load 400, and is capable of charging and discharging.

The AC power supply 109 supplies AC current to the secondary-battery management apparatus 100. Based on a load control signal from the secondary-battery management apparatus 100, the load device 500 causes the battery pack 600 to discharge so that the sum of the current values of the load 400 and the load device 500 may exhibit a predetermined current value.

The circuit disconnection switch 700 is turned on and off based on on and off signals included in the load control signal and disconnects the load device 500 from the system when it is turned off. The battery-pack disconnection switch 840 is opened when a control unit (the secondary-battery management apparatus 100) detects a rise in temperature or voltage of the battery pack and sends out a switch open signal, to protect the battery pack 600 from overcharge or overdischarge.

The load current sensor 800 measures the value of current supplied to the load 400 and outputs a measurement result to the secondary-battery management apparatus 100. The battery-pack charging-and-discharging current sensor 810 detects current supplied from the battery pack 600 and outputs a detection result to the secondary-battery management apparatus 100. The temperature sensor 820 measures the temperature of the battery pack 600 and outputs a measurement result to the secondary-battery management apparatus 100. The voltage sensor 830 detects the voltage of the battery pack 600 and outputs a detection result to the secondary-battery management apparatus 100.

The load current sensor 800 detects the load current and outputs a detection result to the secondary-battery management apparatus 100. The secondary-battery management apparatus 100 creates a daily or weekly load current pattern based on the load current detected by the load current sensor 800 and a period which is measured simultaneously.

The structure of the secondary-battery management apparatus 100 will be described next.

Figure 2:
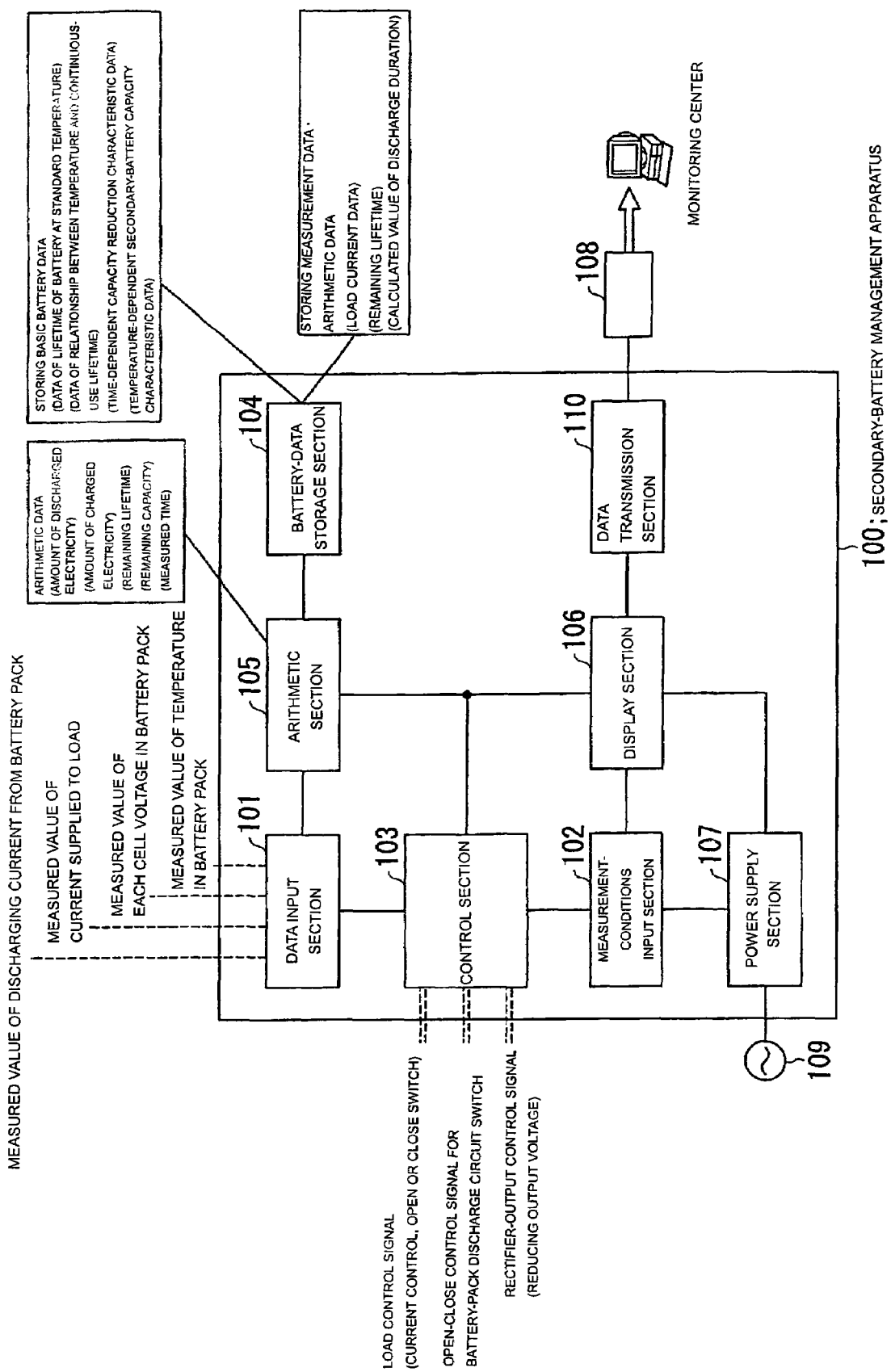
FIG. 2 is a schematic block diagram showing the structure of a secondary-battery management apparatus according to the embodiment.

FIG. 2 is a schematic block diagram showing the structure of the secondary-battery management apparatus 100 of the embodiment.

A data input section 101 receives the measurement results output from the load current sensor 800, the battery-pack charging-and-discharging current sensor 810, the temperature sensor 820, and the voltage sensor 830 and generates an output to a control section 103 and an arithmetic section 105. A measurement-conditions input section 102 has a function for accepting an input from a user via a keyboard and function keys. The control section 103 has a function for outputting a rectifier-output control signal to the rectifier 200 to reduce the voltage output from the rectifier 200 so as to fall within the range of a set value which is input from the measurement-conditions input section 102. The control section 103 also outputs a load control signal to the load device 500 (see FIG. 1) to perform control such that the sum of electrical currents flowing in the load 400 and the load device 500 equals to a set value which is input from the measurement-conditions input section 102.

In the battery-data storage section 104, stores lifetime data at a standard temperature, data about the relationship between the temperature and lifetime (described later with reference to FIG. 6), capacity deterioration characteristic data (described later with reference to FIG. 8), and temperature-dependent characteristic data of the capacity of the secondary battery (described later with reference to FIG. 9) is stored. The lifetime data of the battery at a standard temperature is the usable lifetime of each lithium-ion battery at a given standard temperature, such as ten consecutive years at a constant standard temperature of 25° C. The data is stored as a single numeric value indicating the lifetime at the standard temperature or as a part of data showing the correlation between the temperature and the consecutive lifetime (described later with reference to FIG. 6).

In the battery-data storage section 104, information such as the manufacturer, year of production, model, production lot, and installed period, as battery data is stored.

In the battery-data storage section 104, stored is battery data indicating relationships between terminal voltage differences and different capacities of the battery at a given time; relationships between the open voltage of a battery before use (having a capacity of 100%) and battery terminal voltages in cases where batteries having various capacities are discharged; and relationships between a charge voltage for floating charging (may be abbreviated as a "floating charge voltage" in the following descriptions and figures) and battery terminal voltages in cases where batteries having various capacities are discharged.

When the load current pattern data is created, the arithmetic section 105 assumes that discharging has started at a specified calculation start time, and calculates the available discharge duration T of the secondary battery. Various data stored in the battery-data storage section 104, the calculated discharge duration T, and the like is displayed in a display section. If it is judged that the discharge duration T is insufficient, the display section 106 reports that fact (issues an alarm). The various battery data, the calculation start time for the load current pattern, and the like are input from the measurement-conditions input section 102.

Figure 3:
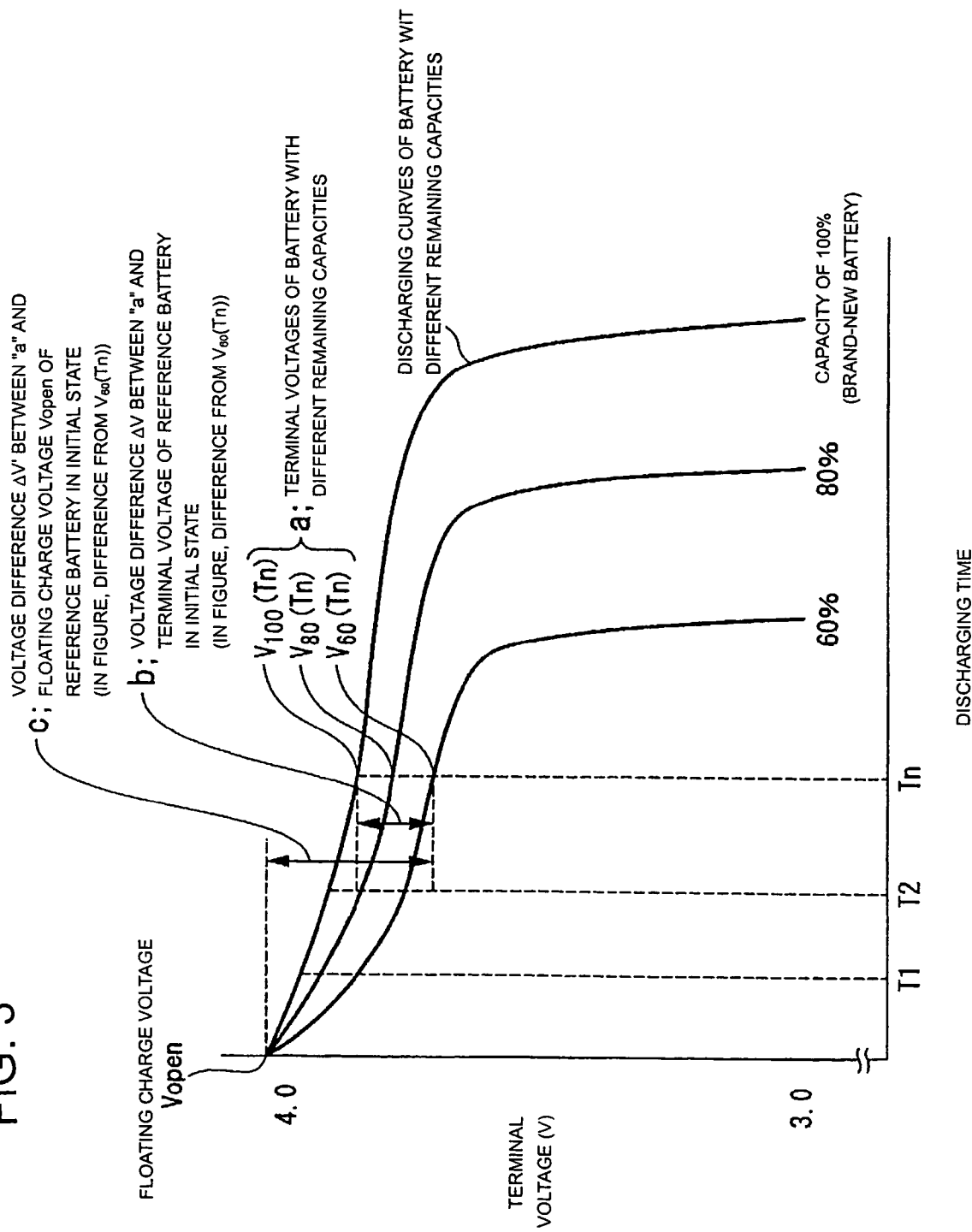
FIG. 3 is a graph showing a voltage difference $\Delta V$ between a terminal voltage of a battery in an initial state and the terminal voltage of the battery having a reduced capacity, at each discharging time.

FIG. 3 is a graph showing a voltage difference $\Delta V$ between the terminal voltage of the battery in the initial state and the terminal voltage of the battery in a degraded state, at each discharging time, and a voltage difference $\Delta V'$ between the floating charge voltage and the terminal voltage of the battery in a degraded state. From the relationships among the curves shown in FIG. 3, the following data is stored in the battery-data storage section 104.

The battery-data storage section 104 stores data indicating the relationship between the terminal voltage and the capacity of the battery in a degraded state, as battery data.

Figure 4:
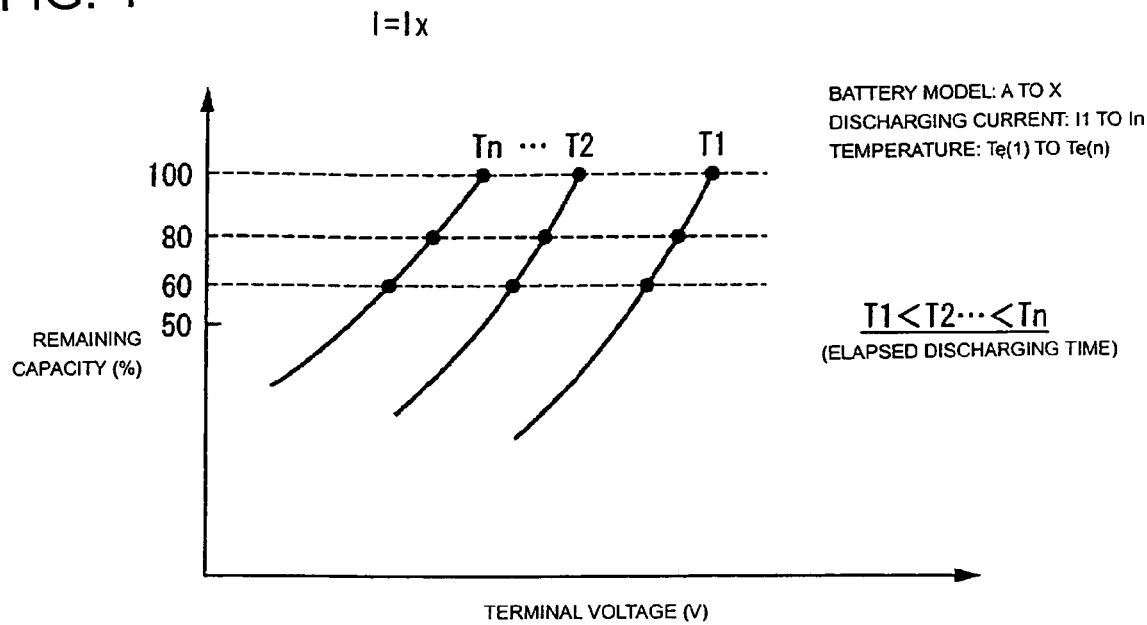
FIG. 4 is a graph schematically showing a discharging curves of a battery in an initial state and discharging curves of the battery having different reduced remaining capacities.

FIG. 4 shows, as one example of the battery data, a graph generated by reading the terminal voltage of respective capacities of the battery at a given discharging time Tn shown in FIG. 3.

The battery-data storage section 104 also stores, as battery data, the relationship between the open voltage and the terminal voltage of the battery having a capacity of 100% at a given elapsed discharging time and the difference of terminal voltages of the battery having a deteriorated capacities.

Figure 5:
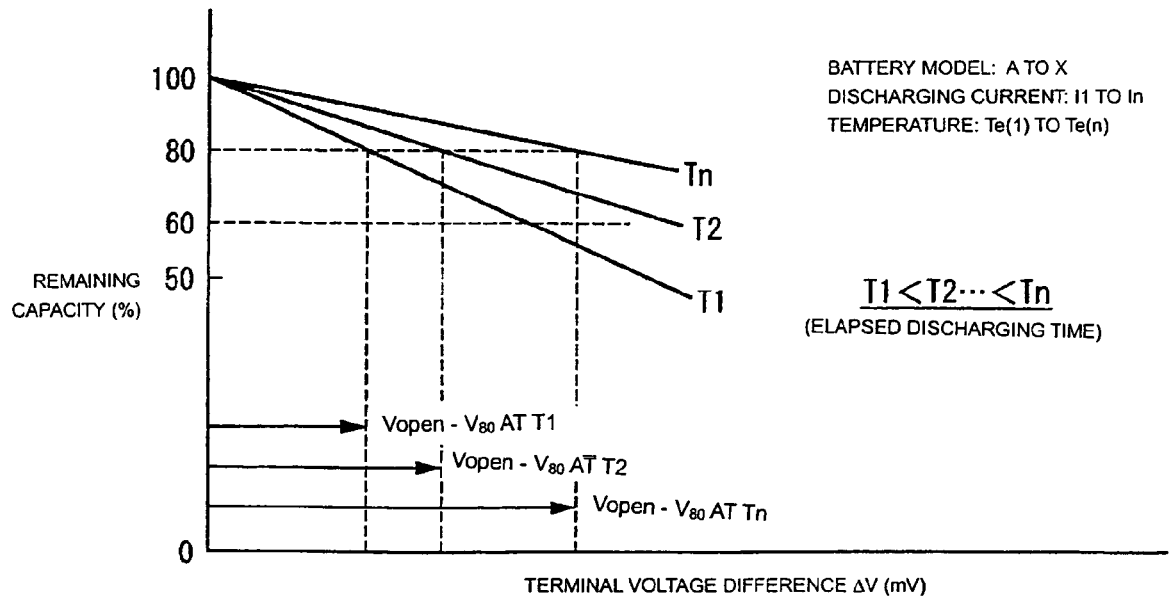
FIG. 5 is a graph showing a difference between an open voltage of a battery having a capacity of 100% and a terminal voltage of the battery having a reduced capacity, at a given elapsed discharging time.

FIG. 5 shows one example of the battery data, in which the differences between the open voltage of the battery having a capacity of 100% and the terminal voltages of the battery with deteriorated (reduced) capacities at a given elapsed discharging time are shown. The differences between the charge voltage in floating charging and the terminal voltages of the battery with reduced capacities can be illustrated in a way similar to that in FIG. 5.

The battery data indicating the differences between the reference voltage and terminal voltages of the battery with reduced capacities are stored in the battery-data storage section 104 (FIG. 2).

The battery data is stored for each battery model (A to X) and for each current value I1 to In. The battery data is generated for each different temperature Te(n) as required. The battery-data storage section 104 also stores the load current pattern of the power supply system, created from the measured load current and the time data obtained simultaneously, measurement values such as discharge duration calculated from the load current pattern, and other calculated values, if necessary.

The arithmetic section 105 calculates the remaining capacity, remaining lifetime, the amount of discharged electricity, the amount of charged electricity, charging rate, and the like of each lithium-ion battery which is the secondary battery by using the input values input from the sensors, and measures the discharge duration and elapsed charging time, with reference to the data stored in the battery-data storage section 104.

The arithmetic section 105 has a function to measure the terminal voltage value of the battery pack 600 (FIG. 1), which is output from the data input section 101, and a function to calculate the remaining capacity of the battery to be measured by comparing the measured terminal voltage value with the data stored in the battery-data storage section 104, to make a judgment about the deterioration.

The arithmetic result of the arithmetic section 105 is displayed on a display screen of the display section 106. A power supply section 107 converts a 100-VAC output from the AC power supply section 109 to DC power and serves as an internal power section of the secondary-battery management apparatus 100. A data transmission section 110 is connected through an external communication interface 108 to a terminal of a monitoring center and sends the data obtained as the arithmetic result of the arithmetic section 105 to a terminal of the monitoring center. A modem, for instance, is used as the external communication interface 108.

Next, a method of calculating the remaining lifetime of the battery pack 600, executed by the arithmetic section 105 of the secondary-battery management apparatus 100, will be described next.

Figure 6:
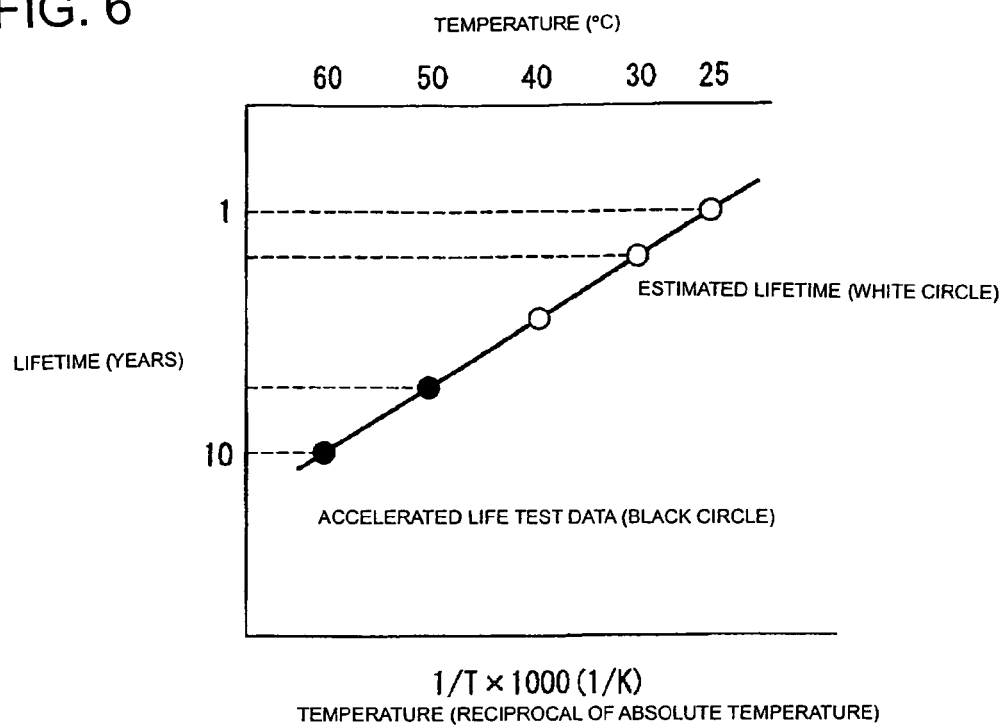
FIG. 6 is a graph showing an example of the relationship between continuous-use lifetime and temperature, which is stored in a battery-data storage section of a secondary-battery management apparatus according to the embodiment.

FIG. 6 is a graph showing one example of the relationship between the temperature and continuous-use lifetime, stored in the battery-data storage section 104 of the secondary-battery management apparatus 100 according to the embodiment. The arithmetic section 105 calculates the remaining lifetime by using the data on the relationship between the temperature and continuous-use lifetime shown in the figure. The continuous-use lifetime means the lifetime in case the battery pack 600 containing lithium-ion batteries is continuously used at a certain temperature. The data on the relationship between the temperature and continuous-use lifetime shown in FIG. 6 shows the relationship between the lifetime at a standard temperature (such as 25° C.) and the lifetime at a temperature higher than the standard temperature. In this embodiment, the relationship data is obtained in case where the installed lithium-ion batteries are used and is stored in the battery-data storage section 104 of the secondary-battery management apparatus 100. Lifetime judgment criteria, such as the time at which the initial capacity is reduced by 30%, are determined depending on usage conditions.

When the secondary battery is a lead-acid storage battery, the judgment criteria includes a capacity reduction of 30%, a capacity reduction of 20%, and the like. A physical period for which the battery is used for a certain period at respective temperatures can be converted to a corresponding periods for which the battery is used under the standard conditions, that is, at the standard temperature, by using the data on the relationship between the temperature and continuous-use lifetime. This conversion is done by multiplying the period of use "D" at a temperature "t" higher than the standard temperature by the ratio of the continuous-use lifetimes Ls/Lt, where Ls indicates continuous-use lifetime determined at the standard temperature, and Lt indicates continuous-use lifetime at the temperature "t" higher than the standard temperature.

It is assumed that a relationship such as continuous lifetime (Lt) of one year at 60° C. (="t") and continuous lifetime (Ls) of 10 years at 25° C. (standard temperature) has already been obtained and is represented by data indicating the relationship between the temperature and continuous-use lifetime. If the battery is used for 0.5 years ("D") at a temperature of 60° C., higher than the standard temperature, the period of use at the standard temperature of 25° C. is calculated by equation 1.

$$\text{(Calculated service period at standard temperature)} = D \times (Ls/Lt) = 0.5 \times (10/1) = 5 \text{(years)} \quad (1)$$

The actual temperature may vary with time, depending on the installation environment. The arithmetic section 105 of the secondary-battery management apparatus 100 calculates a converted period of use depending on daily variations in temperature to estimate the lifetime of the lithium-ion battery.

Figure 7:
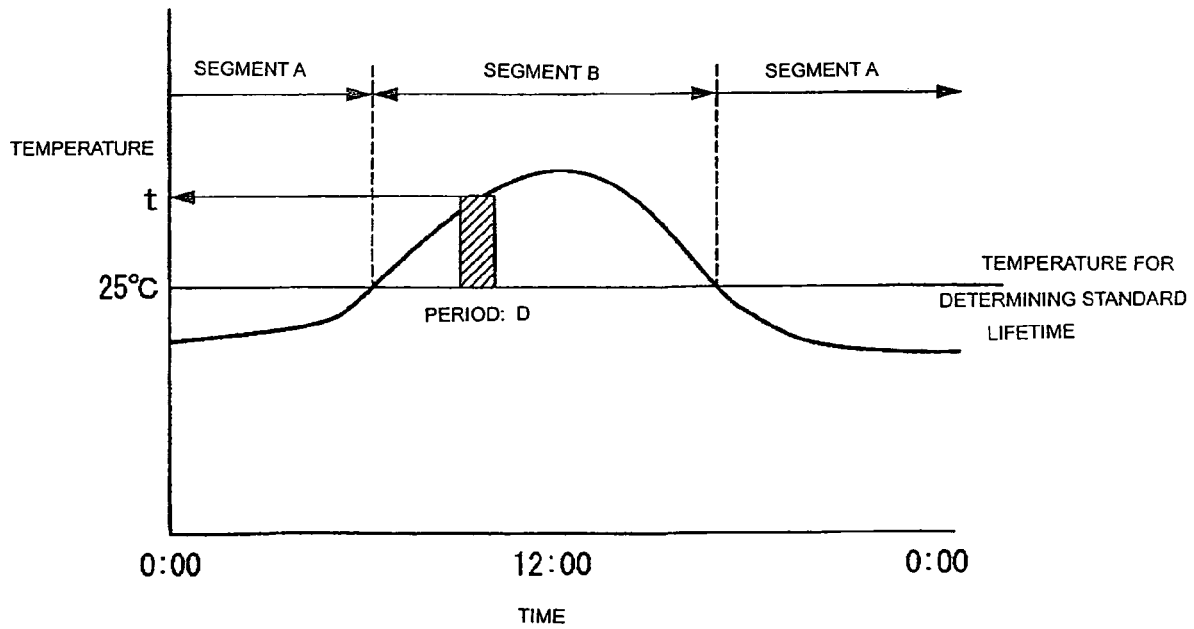
FIG. 7 is a graph showing an example of temperature variations in one day in an actual installation environment.

FIG. 7 is a graph showing one example of temperature variations in one day in the actual installation environment.

In segment A in the figure, the ambient temperature is lower than the temperature for determining the standard lifetime, and in segment B, the ambient temperature is higher than the temperature for determining the standard lifetime. If the temperature for determining the standard lifetime equals the standard temperature, the battery lifetime in the case of the segment A can be regarded as the lifetime at the standard temperature. Accordingly, the period of use in this segment is directly added. The period of use in segment B is converted in consideration of the temperature. This is, a short period "D" (of one hour or thirty minutes, for instance) in segment B is assumed to be a period of average temperature "t" (° C.). Then, the period "D" is converted to the period of use at the temperature for determining the standard lifetime (hereafter referred to as the converted period) using equation 1, that is, $D \times (Ls/Lt)$.

The arithmetic section 105 corrects the period in accordance with variations in temperature in a day and performs this type of calculation for an extended period of one year. The arithmetic section 105 then estimates the remaining lifetime L (Left) of the lithium-ion battery, or the serviceable period of the lithium-ion battery, from the corrected, converted period of use, using equation 2. The display section 106 displays the calculation result.

$$\text{Remaining lifetime } L(\text{Left}) = \{\text{(Continuous-use lifetime } Ls \text{ determined at the temperature for determining the standard lifetime)} - \Sigma(\text{Period in segment } A) - \Sigma(\text{Converted period in segment } B)\} \quad (2)$$

If variations in temperature over one year in the installation environment can be determined, the terms $\Sigma(\text{Period in segment A})$ and $\Sigma(\text{Converted period in segment B})\}$ in equation 2 can be calculated with high precision, and therefore, the remaining lifetime after continuous use in the same installation environment can also be calculated with high precision. The arithmetic section 105 calculates the remaining lifetime of the lithium-ion battery using equation 2, by using results measured by a temperature sensor provided in the installation environment (not shown) or information on variations in temperature over one year in the installation environment, obtained from an external device or recording medium.

Next, the calculation of the remaining capacity of the lithium-ion battery, which is executed by the arithmetic section 105 of the secondary-battery management apparatus 100, will be described.

Figure 8:
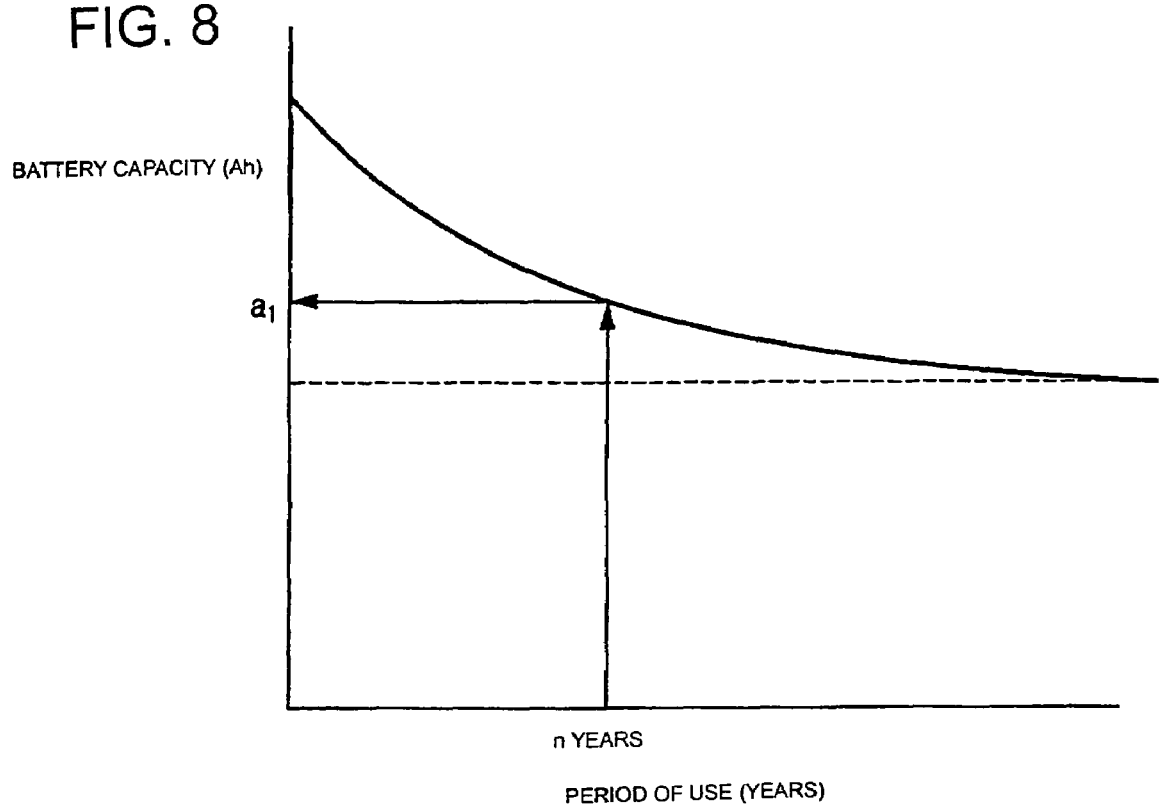
FIG. 8 is a graph showing an example of capacity reduction characteristic data stored in a battery-data storage section of a secondary-battery management apparatus of the embodiment.

FIG. 8 is a graph showing one example of capacity-reduction characteristic data stored in the battery-data storage section 104 of the secondary-battery management apparatus 100 according to the embodiment. The figure shows the relationship between years during which the lithium-ion batteries have been used as the secondary battery and the battery capacity. The relationship indicates that the battery capacity decreases as the years of use increase.

Figure 9:
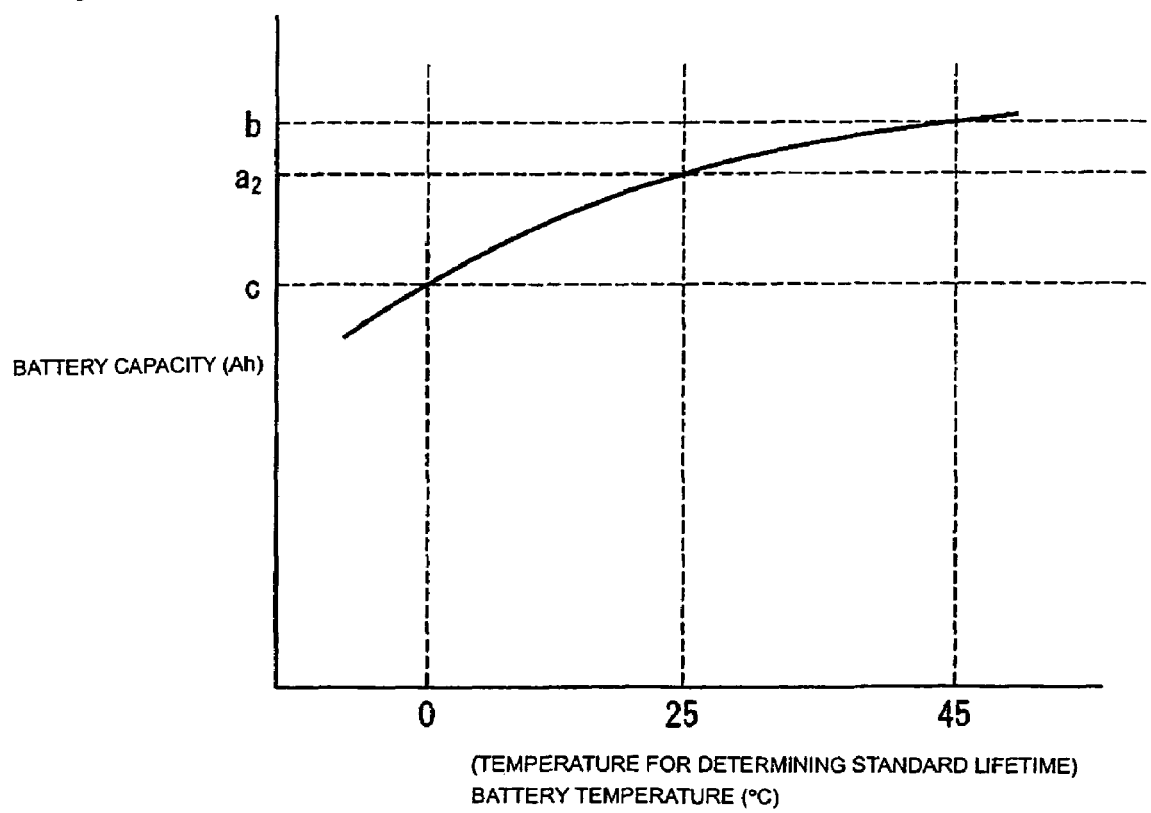
FIG. 9 is a graph showing an example of temperature-dependent secondary-battery capacity characteristic data stored in a battery-data storage section of a secondary-battery management apparatus according to the embodiment.

FIG. 9 is a graph showing one example of temperature-dependent secondary-battery capacity characteristic data stored in the battery-data storage section 104 of the secondary-battery management apparatus 100 according to the embodiment. The figure shows the relationship between the temperature of the lithium-ion batteries used as the secondary battery and the battery capacity. The relationship indicates that the battery capacity increases as the battery temperature increases.

The remaining capacity is calculated by using the converted years of use at the temperature for determining the standard lifetime (standard temperature) and the capacity reduction characteristic data (FIG. 8) and temperature-dependent secondary-battery capacity characteristic data (FIG. 9) stored in the battery-data storage section 104. If the years of use of the lithium-ion batteries as the secondary battery at the temperature for determining the standard lifetime are expressed as "n", this "n" can be obtained from $\Sigma$(Period in segment A)+{$\Sigma$(Converted period in segment B)} in equation 2. The arithmetic section 105 obtains the battery capacity $a_1$ (Ah) at that point corresponding to the years of use n, by using the relationship between the years of use and the battery capacity shown in FIG. 8.

The arithmetic section 105 then corrects the obtained battery capacity $a_1$ (Ah) obtained from the temperature value which has been measured in the installation environment of the lithium-ion battery, and obtains the remaining capacity at that time. The correction is performed in accordance with the temperature-dependent secondary-battery capacity characteristic data shown in FIG. 9. If the relationship of the battery capacity c (Ah) at a temperature of 0° C., the battery capacity $a_2$ (Ah) at a temperature of 25° C. (temperature for determining the standard lifetime), . . . and the battery capacity b (Ah) at a temperature of 45° C. is stored as the temperature-dependent secondary-battery capacity characteristic data, when the temperature sensor 820 of the battery measures a temperature of 45° C., the remaining capacity is "b" (Ah).

After the capacity held in the lithium-ion batteries used as the secondary battery, that is, the remaining capacity, is determined, the discharge duration after the secondary battery starts discharging at a power failure or the like can also be estimated. The arithmetic section 105 calculates the value by dividing the calculated remaining capacity by the actual discharging current measured by the battery-pack charging-and-discharging current sensor 810.

Figure 10:
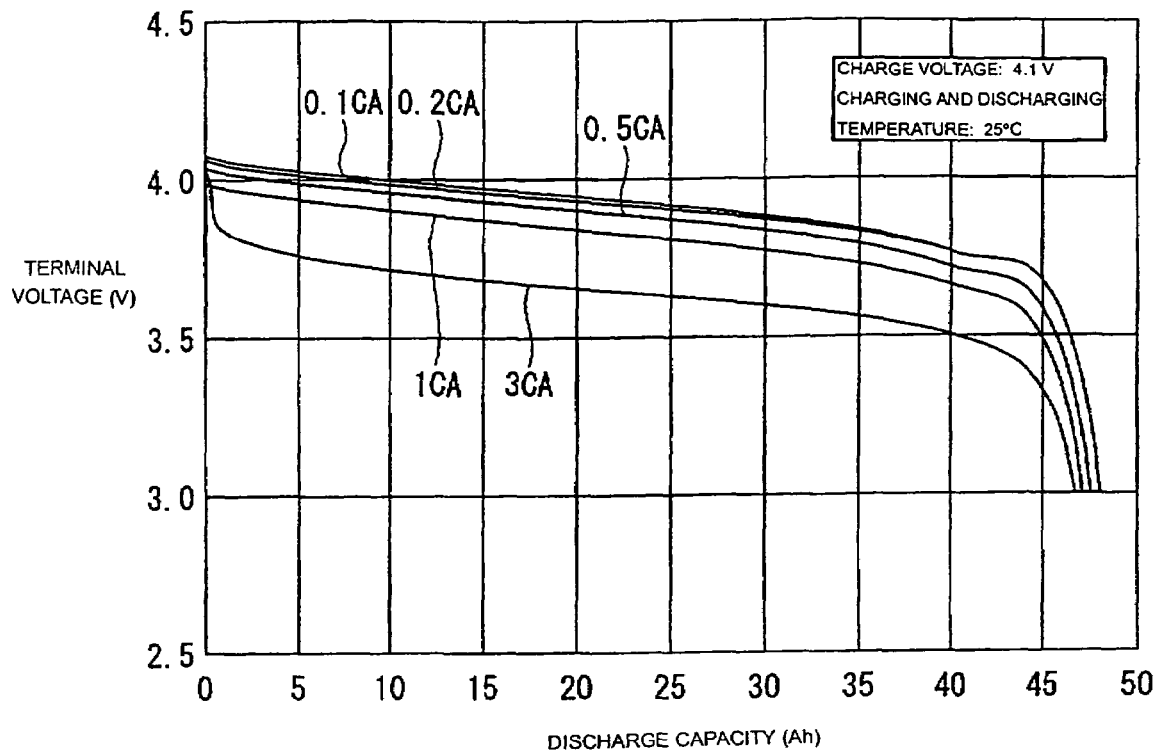
FIG. 10 is a graph showing an example of discharge characteristics of a lithium-ion battery.
Figure 11:
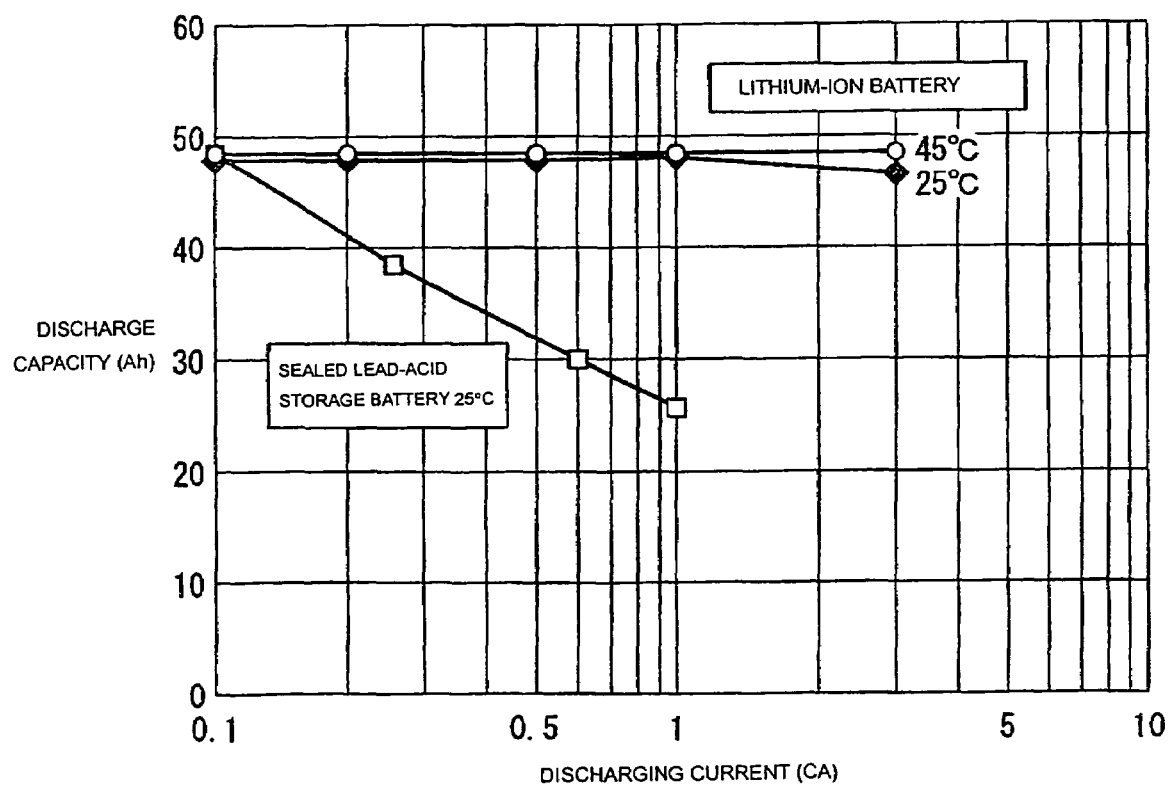
FIG. 11 a graph showing another example of discharge characteristics of the lithium-ion battery.

FIGS. 10 and 11 are graphs showing examples of discharge characteristics of the lithium-ion battery used as the secondary battery. FIG. 10 shows the relationship between the discharge capacity and the terminal voltage, and FIG. 11 shows the relationship between the discharging current and the discharge capacity. FIG. 10 shows the relationship between the discharging capacity and the terminal voltage when the discharging current of the lithium-ion battery is 0.1 CA, 0.2 CA, 0.5 CA, 1 CA, 3 CA (C indicates the capacity (Ah) of the battery) at a charge voltage of 4.1 V and a charging and discharging temperature of 25° C. The relationship between the discharging current and discharge capacity in FIG. 10 is plotted to show the relationship between the discharging current and discharge capacity of the lithium-ion battery which is the battery pack 600 at a temperature of 25° C. in FIG. 11. As shown in FIGS. 10 and 11, the lithium-ion battery has a discharging property such that the discharge capacity (Ah), which is expressed by the product of current (A) and time (h), is nearly constant, irrespective of the discharging current. Accordingly, the continuous discharge duration can be calculated by dividing the remaining capacity by the discharging current. In the lead-acid storage battery, the amount of electricity that can be extracted by discharging decreases as the discharging current increases, so that a capacity reduction ratio must be considered in calculating the continuous discharge duration. The lithium-ion batteries, however, do not require consideration of such a capacity reduction ratio.

When the secondary battery is recharged after discharging, the arithmetic section 105 adds up the amount of charged electricity obtained by multiplying the charging current measured by the battery-pack charging-and-discharging current sensor 810 and the charging time, on the basis of the amount of electricity at the end of discharging, that is, the inverse of the procedure for converting the amount of electricity in discharging.

Figure 12:
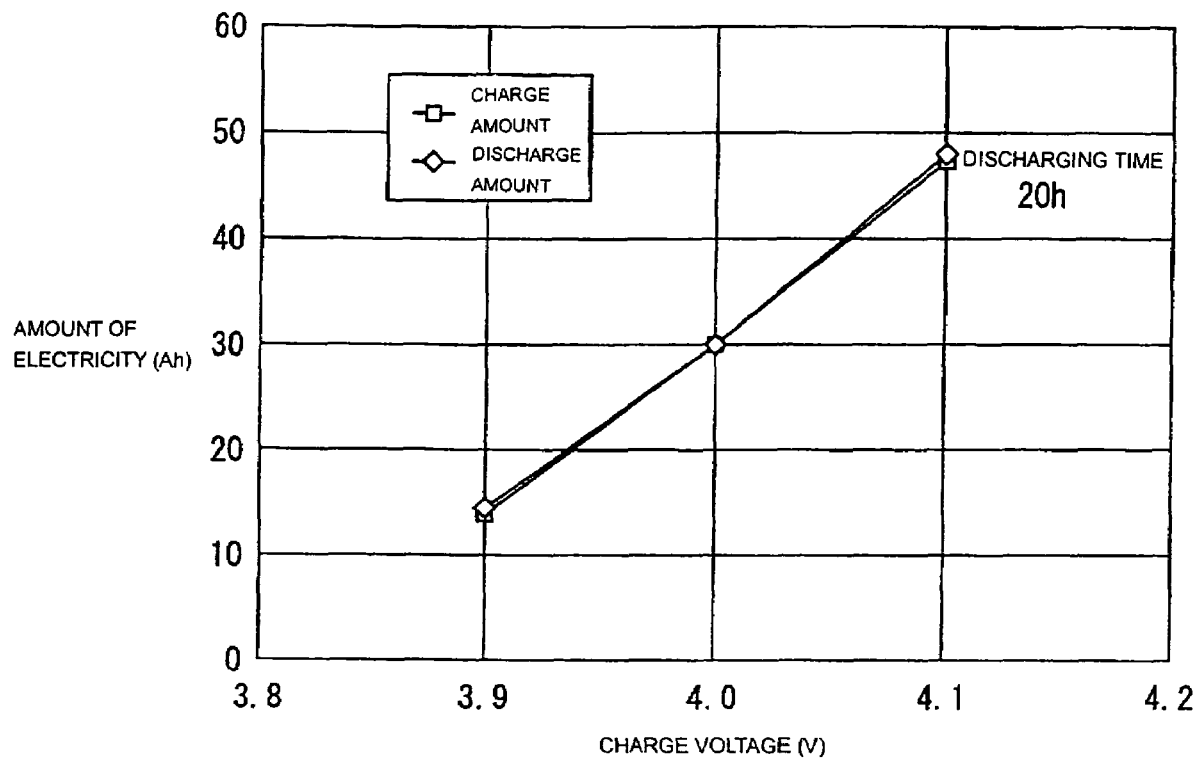
FIG. 12 is a graph showing the relationship between charge voltage and the amount of discharged electricity of a lithium-ion battery.

FIG. 12 is a graph showing the relationship between the charge voltage and the amount of discharged electricity of the lithium-ion battery.

In the figure, the relationship between the charge voltage and the amount of discharged electricity of the lithium-ion battery is based on such a charging property of the lithium-ion battery that almost all of the applied electricity is stored as effective electricity and is used in the next discharging (that is, the charging efficiency is nearly 100%).

The ratio of the value obtained by adding up the amount of electricity applied in charging is displayed as the charging ratio of the lithium-ion battery with respect to the remaining capacity being specified as 100%.

The capacity decreases from the initial state with the passage of years of use, and the charging ratio may be calculated and displayed when the initial capacity of the battery is regarded as 100% at the initial state where it is installed. The secondary-battery management apparatus 100 also has a function to monitor the terminal voltage of the lithium-ion batteries.

Figure 13:
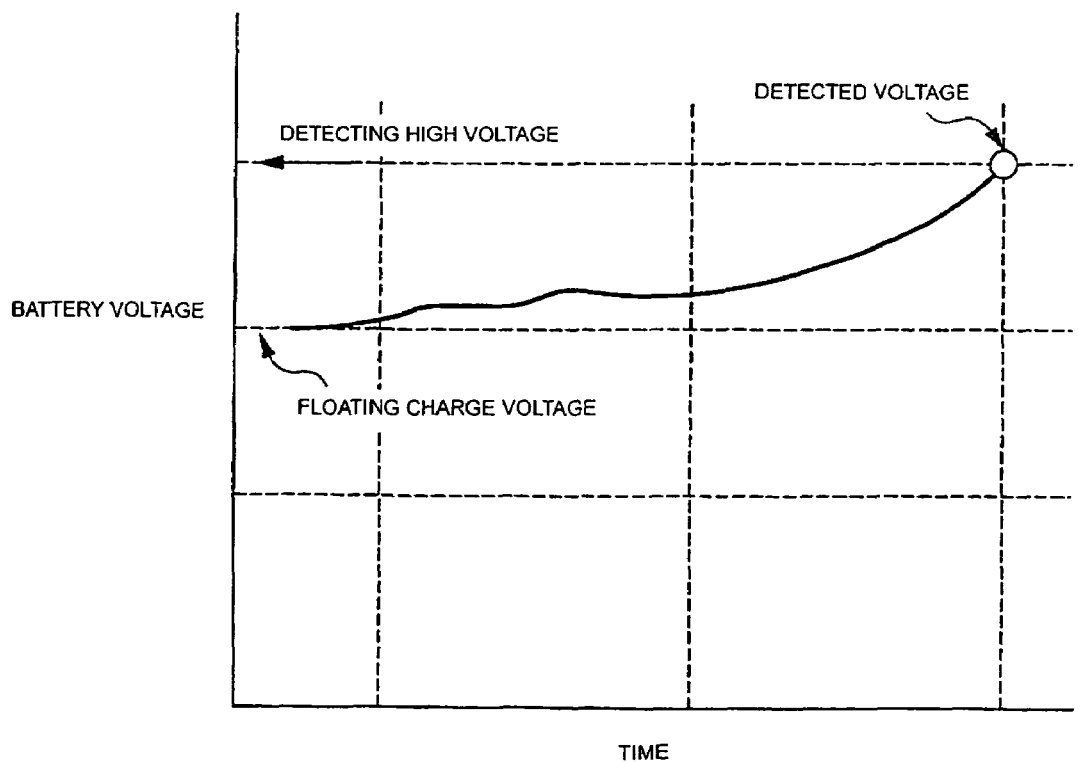
FIG. 13 is a graph illustrating detection of a high voltage during floating charging.
Figure 14:
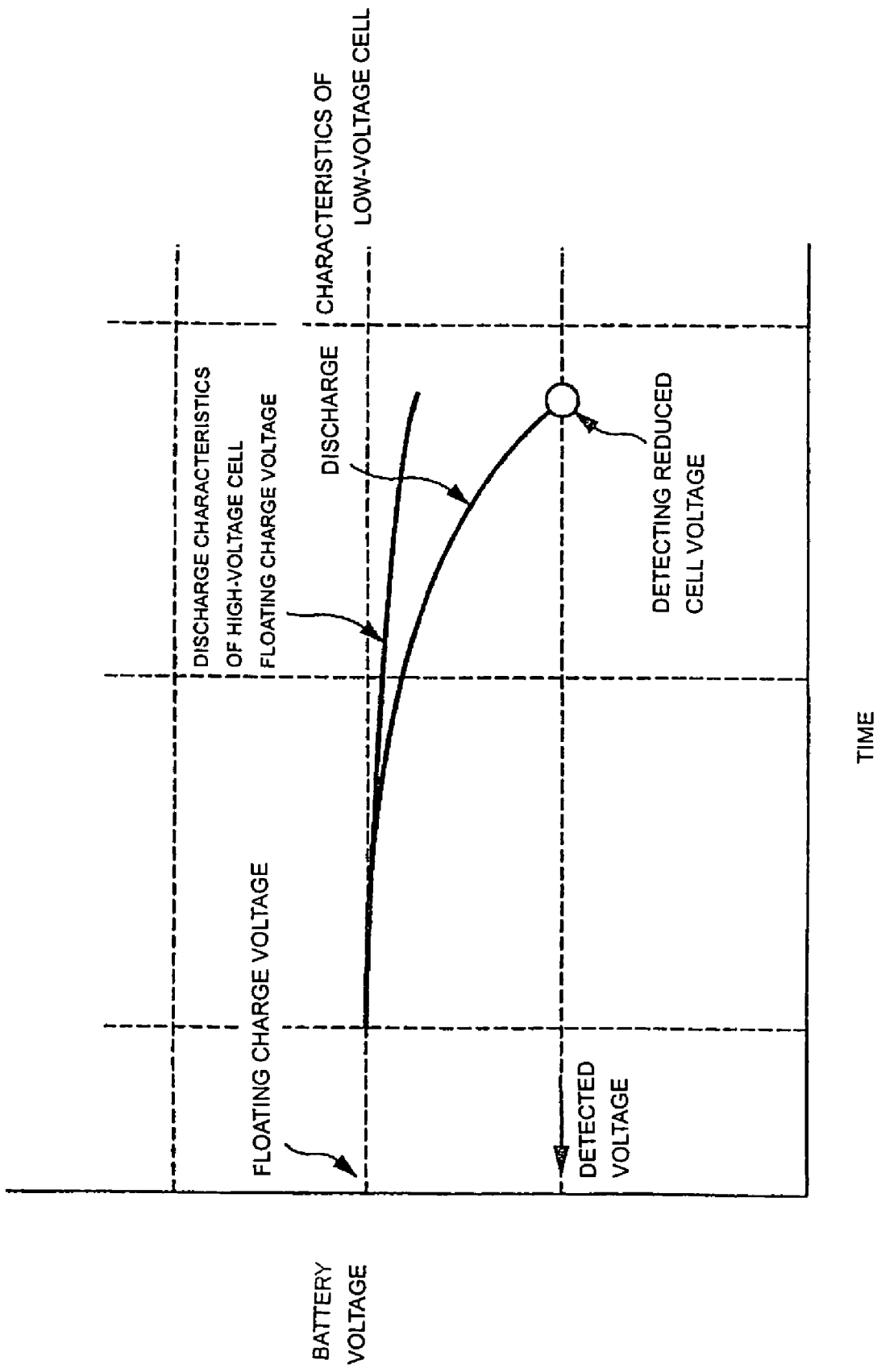
FIG. 14 is a graph illustrating the detection of a discharge stop voltage during discharging.

FIG. 13 is a graph illustrating high-voltage detection during floating charging, and FIG. 14 is a graph illustrating discharge-stop-voltage detection during discharging. In the terminal voltage monitor function of the arithmetic section 105, the voltage of the lithium-ion batteries is always monitored by using the voltage sensor 830 of the battery. When the battery voltage exceeds a predetermine level (such as 4.2 to 4.5 V) in floating charging or falls at or below a predetermined level (such as 3.0 to 2.8 V) in discharging, an alarm is issued on the display section 106 or the like. Alternatively, the alarm is transferred to an external device, such as the monitoring center.

When a voltage outside the predetermined range is detected, the arithmetic section 105 of the secondary-battery management apparatus 100 activates the battery-pack disconnection switch 840 to stop charging or discharging of the lithium-ion battery.

FIGS. 15 to 21 are flow charts showing examples of processing according to the embodiment.

Figure 15:
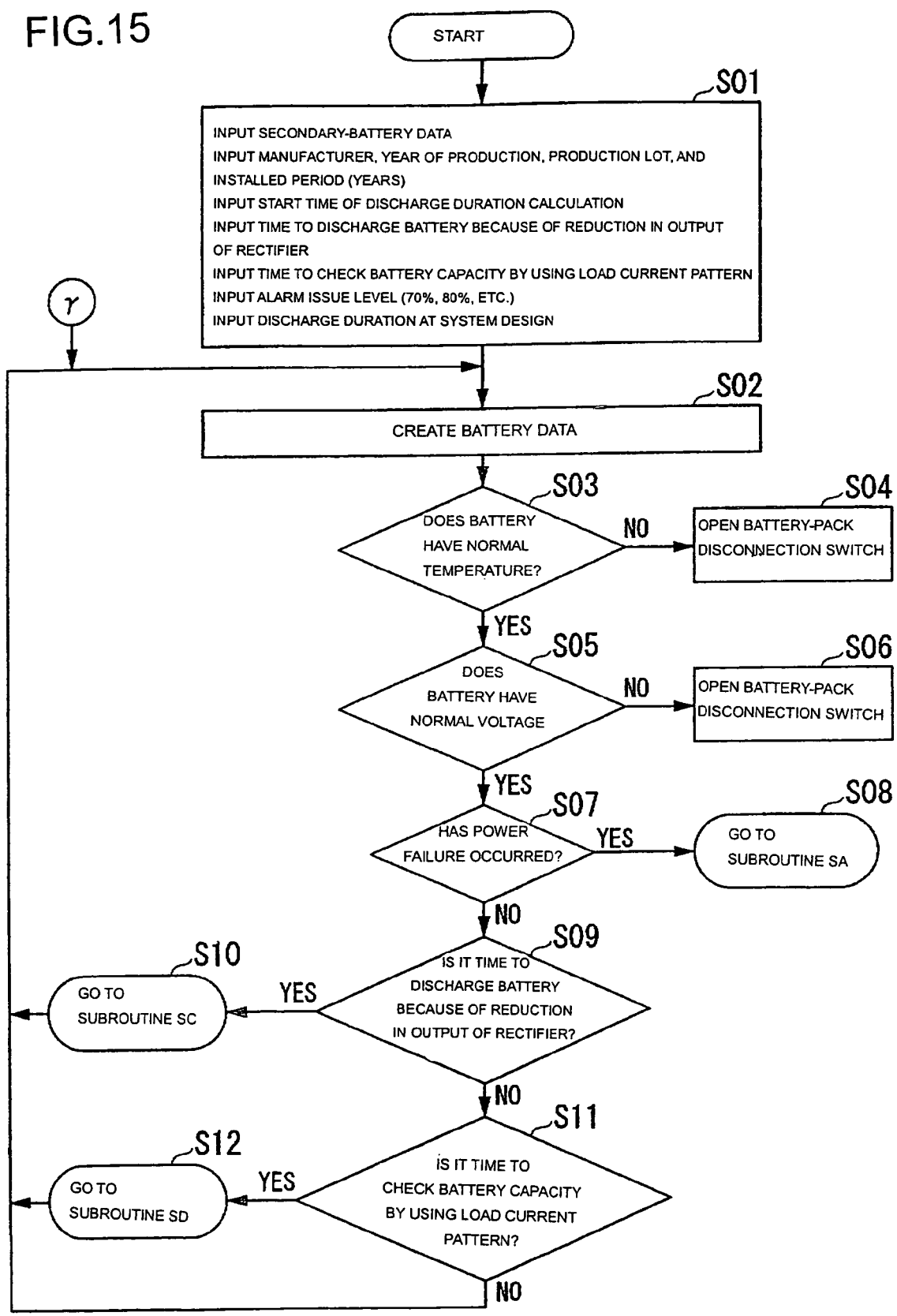
FIG. 15 is a flow chart showing an example of processing in the embodiment.

From the measurement-conditions input section 102 (FIG. 2) of the secondary-battery management apparatus 100 data is input (step S01 of FIG. 15). The data is input in step S01 in which the data includes the secondary battery data (such as the manufacturer, year of production, production lot, and installed period), the start time specified for the calculation of the discharge duration, the execution time of battery capacity check using the load current pattern, and the execution time of battery discharging due to reduction in output of the rectifier.

An alarm issuance level (such as 70% or 80%) is also input in the step S01. The continuous discharge duration at the time of system design is also input in the step S01.

Figure 16:
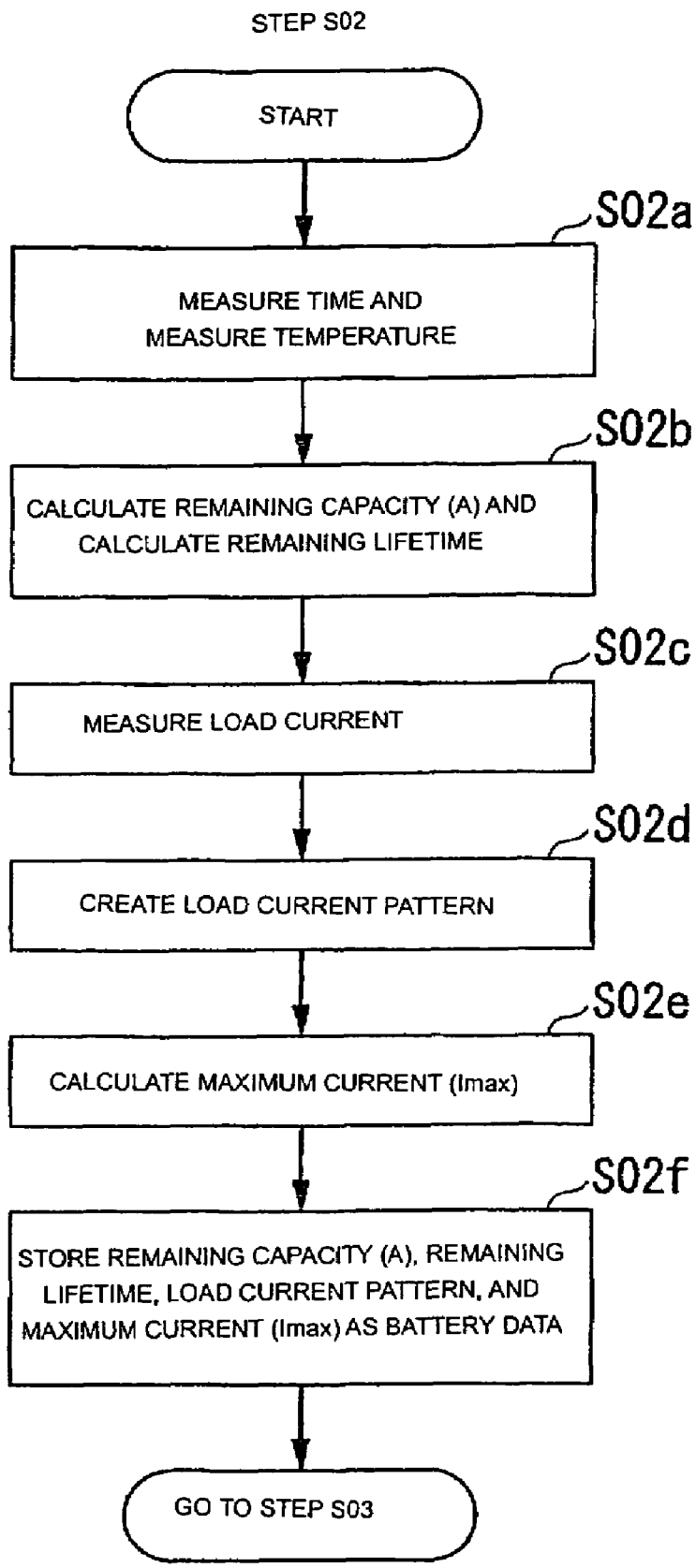
FIG. 16 is a flow chart showing an example of processing in the embodiment.

While the lithium-ion battery is in a standby state (a waiting state), battery data is created and stored in the battery-data storage section 104 (step S02). The standby state is a state in which the AC power supply 300 or the rectifier 200 supplies power to the load 400 normally, and the lithium-ion battery is not recharged nor discharged after discharging. In step S02, steps S02a to S02f shown in FIG. 16 are carried out. The arithmetic section 105 of the secondary-battery management apparatus 100 measures time by its internal clock or the like and obtains the information on the temperature of the lithium-ion batteries measured by the temperature sensor 820 from the data input section 101 (step S02a). The arithmetic section 105 then calculates the remaining capacity (A) and the remaining lifetime (step S02b. The load current is measured (step S02c), a load current pattern is created (step S02d), and the maximum current (Imax) is calculated (step S02e). The remaining capacity (A and the remaining lifetime) calculated in step S02b, the load current pattern created in step S02d, and the maximum current (Imax) calculated in step S02e are stored in the battery-data storage section 104 as battery data (step S02f).

After the process of step S02 in FIG. 15, the arithmetic section 105 judges that the battery is in the standby state if a power failure detection sensor (not shown) makes no notification of the detection of a power failure and/or if the battery-pack charging-and-discharging current sensor 810 does not detect a charging or discharging current. The arithmetic section 105 determines whether or not the battery has a normal temperature, in accordance with the obtained information on measured temperature (step S03). This check is made, for instance, by checking whether the measured temperature is within a predetermined range. If an abnormal temperature is detected (NO is step 03), the arithmetic section 105 outputs an instruction to open the battery-pack disconnection switch 840 (step S04). The battery-pack disconnection switch 840 is opened when instructed by the secondary-battery management apparatus 100.

If a normal temperature is detected (YES in step S03), the arithmetic section 105 obtains the information on the voltage of the lithium-ion battery measured by the voltage sensor 830 from the data input section 101. The arithmetic section 105 checks whether the battery has a normal voltage, in accordance with the obtained information on the measured voltage (step S05). This check is made, for instance, by checking whether the measured voltage is within a predetermined range (see FIG. 12). If an abnormal voltage is detected (NO in step S05), the arithmetic section 105 outputs an instruction to open the battery-pack disconnection switch 840 (step S06). When the instruction is received, the battery-pack disconnection switch 840 is opened.

If a normal voltage is detected (YES in step S05), the arithmetic section 105 checks whether a power failure has occurred (step S07). This check is made by checking whether information on the occurrence of a power failure is received through the data input section 101 from the power failure detection sensor.

If it is judged that a power failure has occurred (YES in step S07), the process proceeds to a subroutine SA (step S08). In steps S08a to S08q of the subroutine SA shown in FIGS. 17 and 18, the amount of electricity during discharging and after discharging is managed. The arithmetic section 105 measures the discharging current of the lithium-ion battery (Id) (hereafter referred to as the secondary-battery discharging current) and the continuous discharge duration (hd) by obtaining the information on the discharging current of the lithium-ion battery measured by the battery-pack charging-and-discharging current sensor 810 from the data input section 101 (step S08a). The arithmetic section 105 obtains the information on the temperature of the lithium-ion batteries measured by the temperature sensor 820 from the data input section 101 and determines whether the battery has an abnormal temperature (step S08b). If an abnormal temperature is detected (NO in step S08b), the arithmetic section 105 outputs an instruction to open the battery-pack disconnection switch 840 (step S08c). If a normal temperature is detected (YES in step S08b), the arithmetic section 105 obtains the information on the voltage of the lithium-ion battery measured by the voltage sensor 830 from the data input section 101 and determines whether the battery has a normal voltage (step S08d). If an abnormal voltage is detected (NO in step S08d), the arithmetic section 105 outputs an instruction to open the battery-pack disconnection switch 840 (step S08e).

If a normal voltage is detected (YES in step S08d), the arithmetic section 105 calculates the remaining capacity (B) of the lithium-ion batteries during discharging (step S08f), and outputs the calculation result to the display section 106. The remaining capacity (B) during discharging is calculated from equation 3 as set forth below.

$$\text{(Remaining capacity }(B)\text{ during discharging)}=\text{(Calculated remaining capacity }(A)\text{ in the standby state)}-\{(\text{Measured secondary-battery discharging current }(Id))\times(\text{Measured discharge duration value }(hd))\} \quad (3)$$

The arithmetic section 105 determines whether the power failure has ended and whether the lithium-ion batteries used as the secondary battery has started charging (step S08g). This determination may be performed by checking whether the information of end of power failure has been received through the data input section 101 from the power failure detection sensor and whether the battery-pack charging-and-discharging current sensor 810 has received information that a charging current has been measured. If the arithmetic section 105 judges that the power failure has not ended or that the lithium-ion battery has not started charging (step S08g: No), the secondary-battery management apparatus 100 repeats the process from step S08a.

If it is judged that the power failure has ended and the lithium-ion batteries has started charging (YES in step S08g), the battery is in the charging state.

Figure 17:
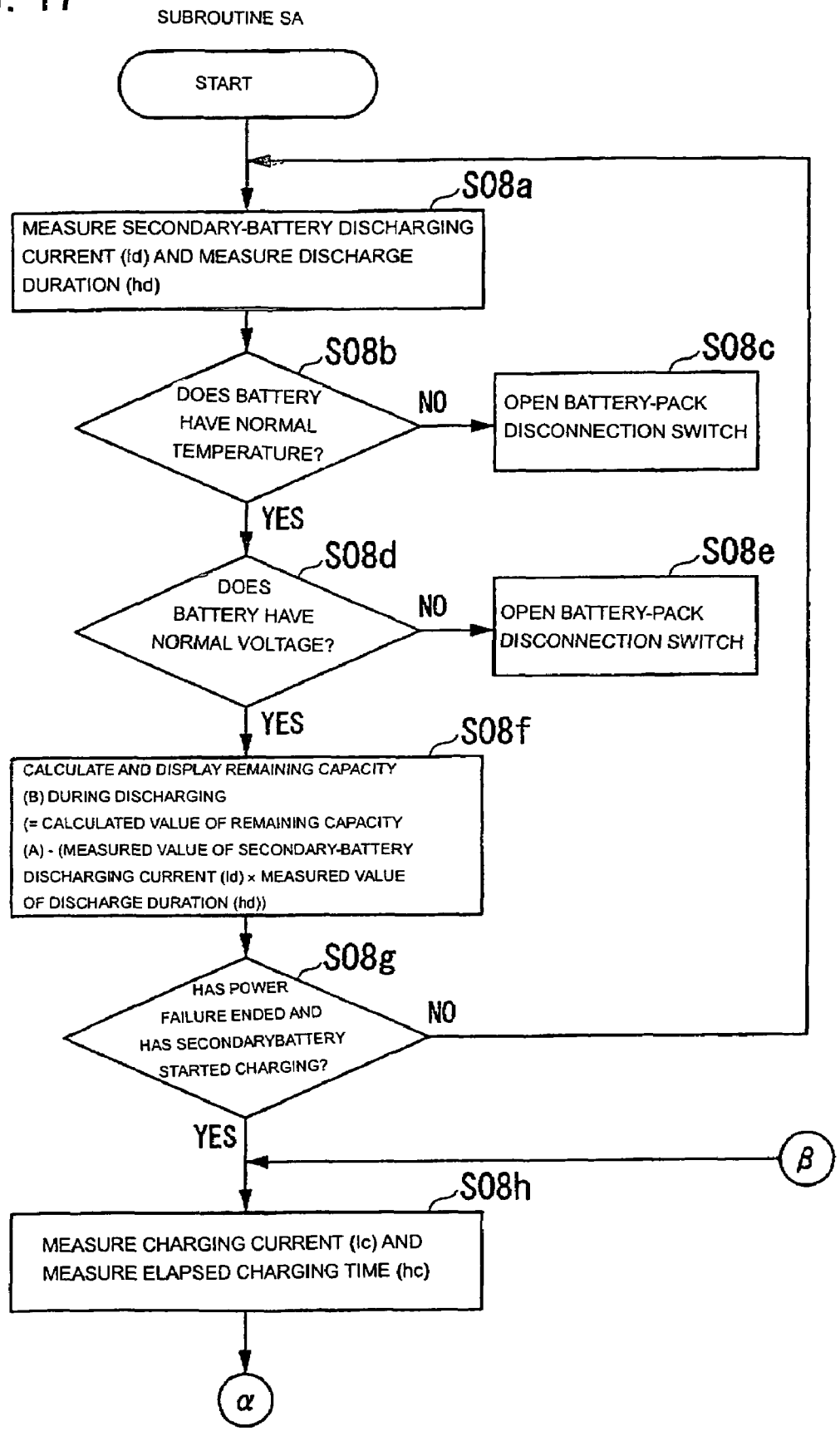
FIG. 17 is a flow chart showing an example of processing in the embodiment.

As shown in FIG. 17, the arithmetic section 105 measures the charging current of the lithium-ion battery (hereafter referred to as a secondary-battery charging current) (Ic) and the elapsed discharging time (hc) by obtaining the information on the discharging current measured by the battery-pack charging-and-discharging current sensor 810 from the data input section 101 (step S08h).

Figure 18:
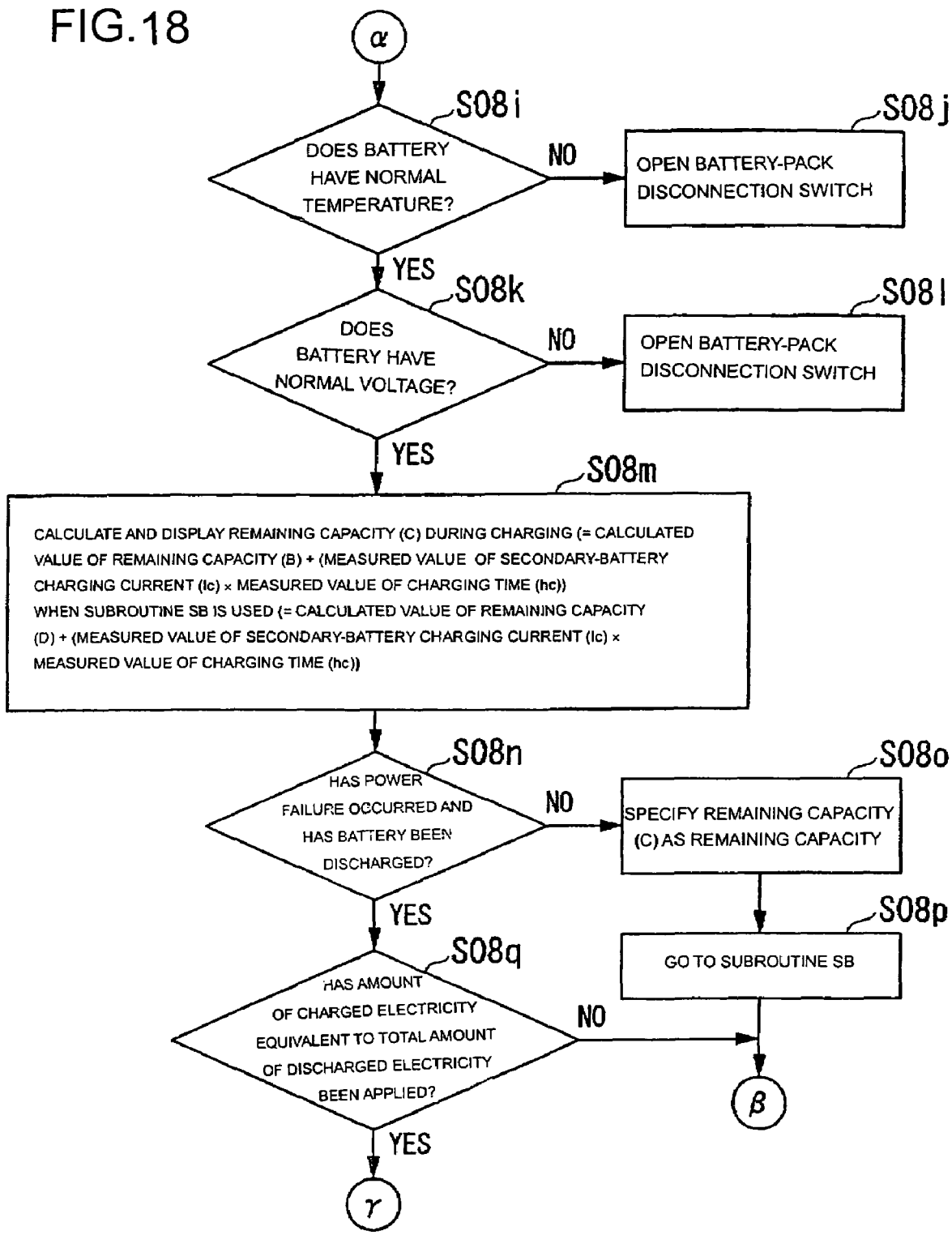
FIG. 18 is a flow chart showing an example of processing in the embodiment.

The arithmetic section 105 obtains the information on the temperature of the lithium-ion battery measured by the temperature sensor 820 from the data input section 101 and determined whether the battery has a normal temperature (step S08i in FIG. 18). If an abnormal temperature is detected (NO in step S08i), the arithmetic section 105 outputs an instruction to open the battery-pack disconnection switch 840 (step S08j). If a normal temperature is detected (YES in step S08i), the arithmetic section 105 obtains the information on the voltage of the lithium-ion battery measured by the voltage sensor 830 from the data input section 101 and determines whether the battery has a normal voltage (step S08k). If an abnormal voltage is detected (NO in step S08k), the arithmetic section 105 outputs an instruction to open the battery-pack disconnection switch 840 (step S08l).

If a normal voltage is detected (YES in step S08k), the arithmetic section 105 calculates the remaining capacity (C) of the lithium-ion battery during charging (step S08m) and outputs the calculation result to the display section 106 so as to display the result thereon. The remaining capacity (C) during charging is calculated from equation 4 given below. If a subroutine SB (FIG. 19), which will be described later, is executed, the capacity is calculated from equation 5 given below.

(Remaining capacity (C) during charging)=(Calculated remaining capacity (B) in discharged state)+{(Measured secondary-battery charging current (Ic))}×{Measured elapsed charging time (hc))} (4)

(Remaining capacity (C) during charging)=(Calculated remaining capacity (D) in discharged state)+{(Measured secondary-battery charging current (Ic))}×{Measured elapsed charging time (hc))} (5)

In the charging state, the arithmetic section 105 determines whether a power failure has occurred and whether the lithium-ion battery has discharged (step S08n). This determination is made by checking whether the information on the occurrence of a power failure has been received through the data input section 101 from the power failure detection sensor and whether the information that a discharging current has been measured by the battery-pack charging-and-discharging current sensor 810 has been received.

If it is judged that no power failure has occurred or no discharging has occurred (NO in step S08n), the arithmetic section 105 determines whether the amount of charged electricity equivalent to the total amount of discharged electricity has been applied (step S08q). The total amount of discharged electricity is calculated by the product of {Measured secondary-battery discharging current (Id)}×{Measured discharge duration (hd)}, used in equation 3 in step S08f shown in FIG. 17. The amount of charged electricity is calculated by the product of {Measured secondary-battery charging current (Ic)}×{Measured elapsed charging time (hc)}, used in equation 4 or 5 in step S08m. If it is judged that the amount of charged electricity equivalent to the total amount of discharged electricity has not been applied (NO in step S08q), the charging state is maintained, and the process from step S08h (FIG. 17) is repeated. If it is judged that the amount of charged electricity equivalent to the total amount of discharged electricity has been applied (YES in step S08q), the battery enters the standby state, and the process from step S02 shown in FIG. 15 is repeated.

If it is judged in step S08n that a power failure has occurred and that the discharge of lithium-ion battery has been carried out (YES in step S08n), the arithmetic section 105 specifies the remaining capacity (C) in charging, calculated in step S08m (step S08o) as the remaining capacity of the lithium-ion battery and executes the subroutine SB (FIG. 19) for calculating the remaining capacity (D) (step S08p) when discharging is performed in a charging state.

Figure 19:
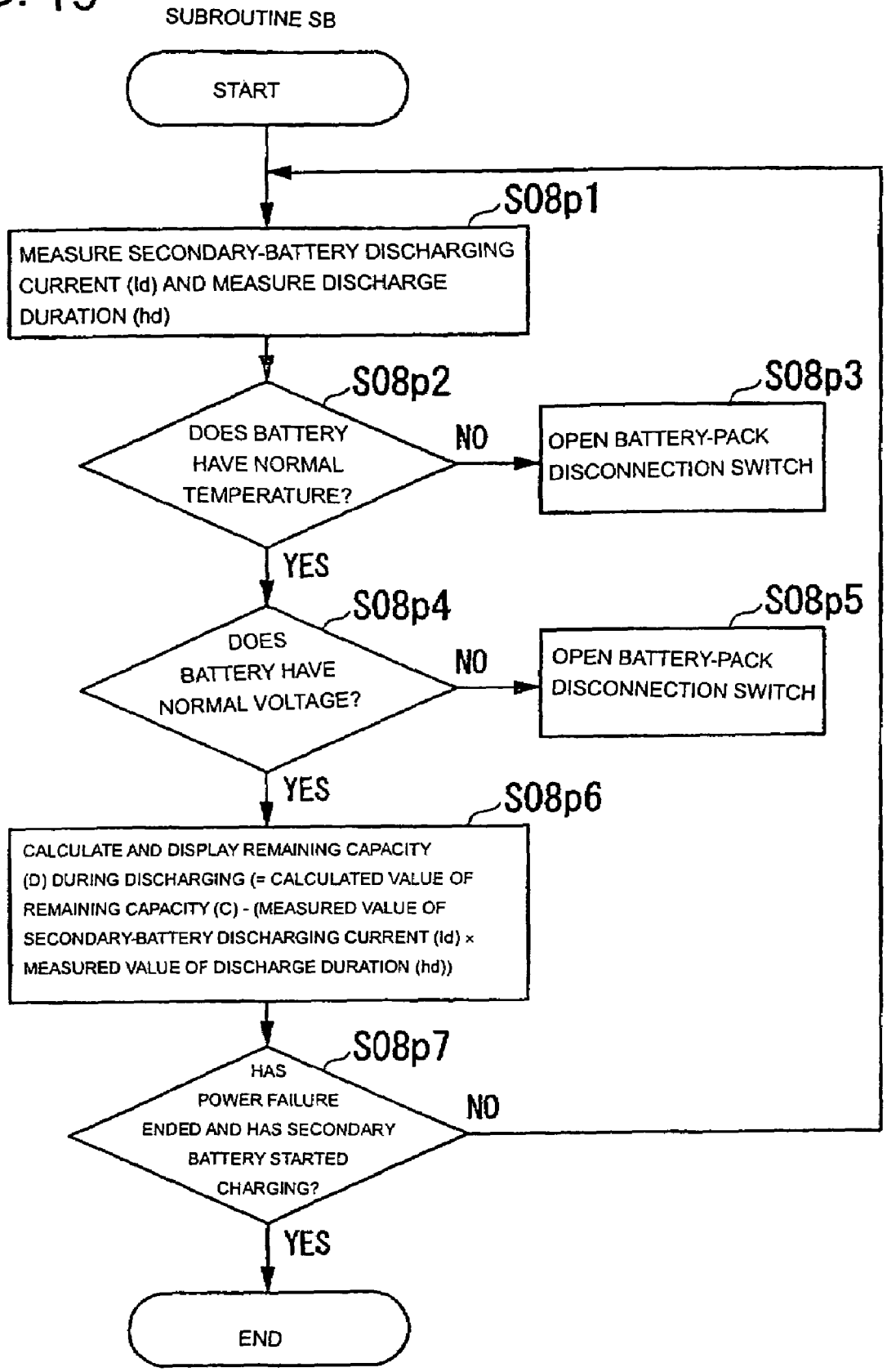
FIG. 19 is a flow chart showing an example of processing in the embodiment.

FIG. 19 is a flow chart showing the process of the subroutine SB for calculating the remaining capacity when discharging is performed in a charging state.

The arithmetic section 105 measures the secondary-battery discharging current (Id), that is, the discharging current of the lithium-ion battery, and the continuous discharge duration (hd), by obtaining the information on the discharging current measured by the battery-pack charging-and-discharging current sensor 810 from the data input section 101 (step S08p1). The arithmetic section 105 obtains the information on the temperature of the lithium-ion battery measured by the temperature sensor 820 from the data input section 101 and determines whether the battery has a normal temperature (step S08p2). If an abnormal temperature is detected (NO in step S08p2), the arithmetic section 105 outputs an instruction to open the battery-pack disconnection switch 840 (step S08p3). If a normal temperature is detected (YES in step S08p2), the arithmetic section 105 obtains the information on the voltage of the lithium-ion battery measured by the voltage sensor 830 from the data input section 101 and determines whether the battery has a normal voltage (step S08p4). If an abnormal voltage is detected (NO in step S08p4), the arithmetic section 105 outputs an instruction to open the battery-pack disconnection switch 840 (step S08p5).

If a normal voltage is detected (YES in step S08p4), the arithmetic section 105 calculates the remaining capacity (D) of the lithium-ion battery during discharging (step S08p6) and outputs the calculation result to the display section 106. The remaining capacity (D) during discharging is calculated using equation 6 given below.

(Remaining capacity (D) during discharging)=(Calculated remaining capacity (C) in charging state)−{(Measured secondary-battery discharging current (Id)}×{Measured discharge duration (hd))} (6)

The arithmetic section 105 determines whether the power failure has ended and whether the battery has started charging (step S08p7). If it is judged that the power failure has not ended and that the lithium-ion battery has not started charging (NO in step S08p7), the process from step S08p1 is repeated.

If the power failure has ended and the battery has started charging, the process from step S08h in the charging state, shown in FIG. 17, is repeated. In that case, in step S08m shown in FIG. 18, the remaining capacity (C) of the lithium-ion batteries during charging is calculated from equation 5, and the calculation result is output to the display section 106, such as a display monitor.

A major function of the secondary-battery management apparatus 100 is to calculate the remaining capacity, remaining lifetime, and the like of the lithium-ion battery, but the apparatus can also be used in combination with an apparatus for controlling the charging of the lithium-ion battery, an apparatus for measuring the internal resistance, or the like. It is needless to say that the combined use of those apparatuses raises no problem.

The lithium-ion batteries in the embodiment are used as a lithium-ion battery pack, but the lithium-ion batteries can also be a single monoblock lithium-ion battery containing a plurality of cells housed in a single case.

As has been described above, while the AC power supply and the charger are operated normally, the secondary-battery management apparatus 100 measures the temperature of the lithium-ion battery to be managed and calculates the remaining capacity and the remaining lifetime of the lithium-ion battery in accordance with the measured temperature. If the lithium-ion battery discharges because of a failure of the AC power supply 300 or the rectifier 200, the secondary-battery management apparatus 100 measures the discharging current and calculates the remaining capacity in accordance with the discharging current. When the AC power supply 300 is restored and when the lithium-ion battery is charged, the secondary-battery management apparatus 100 measures the charging current to the lithium-ion battery and calculates the capacity of the lithium-ion battery in accordance with the charging current.

The arithmetic section 105 of the secondary-battery management apparatus 100 calculates the remaining lifetime, or the serviceable period, by storing the data on the lifetime at the standard temperature and the data on the relationship between the temperature and the continuous-use lifetime in the battery-data storage section 104 and by directly summing the period of use when the lithium-ion battery is used at the temperature for determining the standard lifetime or below and converting the period of use when the battery is used above the temperature for determining the standard lifetime into the period of use at the temperature for determining the standard lifetime and adding up the converted period, and subtracting the sum of the periods from the lifetime in the standard state, obtained from the battery-data storage section 104. The period of use at or above the temperature for determining the standard lifetime is converted into the period of use at the temperature for determining the standard lifetime by multiplying the period of use at or above the temperature for determining the standard lifetime by the ratio of the period Ls determined at the temperature for determining the standard lifetime to the lifetime Lt in continuous use at each temperature, or Ls/Lt.

The time-dependent capacity reduction characteristic data and the temperature-dependent secondary-battery capacity characteristic data are stored in the battery-data storage section 104 in preparation for obtaining the remaining capacity of the lithium-ion battery discharged as the secondary battery. The period of use of the lithium-ion batteries in the standard state is calculated by the method described above, and the capacity of the secondary battery at the time corresponding to the calculated period of use is obtained from the capacity reduction characteristic data. The obtained capacity of the secondary battery is converted into the capacity at the actually measured temperature by using the temperature-dependent secondary-battery capacity characteristic data.

While discharging is in progress, the remaining capacity of the lithium-ion batteries is updated by measuring the discharging current of the lithium-ion batteries and subtracting from the remaining capacity the amount of electricity calculated from the actually measured value and the discharge duration.

When the AC power supply 300 is restored and charging is performed, the remaining capacity of the lithium-ion batteries is calculated by adding the amount of electricity obtained from the product of the actually measured value of the charging current and the charging time to the remaining capacity of the lithium-ion battery which has been calculated by the time of restoration of the AC power supply 300.

If it is judged, in step S07 shown in FIG. 15, that a power failure has not occurred (NO in step S07), the control section 103 of the secondary-battery management apparatus 100 judges whether the battery should be discharged by means of a reduction in output of the rectifier (step S09). The time to discharge the battery by means of a reduction in output of the rectifier is determined by using the data specified in step S01. If the battery should be discharged by means of a reduction in output of the rectifier (YES in step S09), the process of a subroutine SC (FIG. 20) is performed (step S110).

Figure 20:
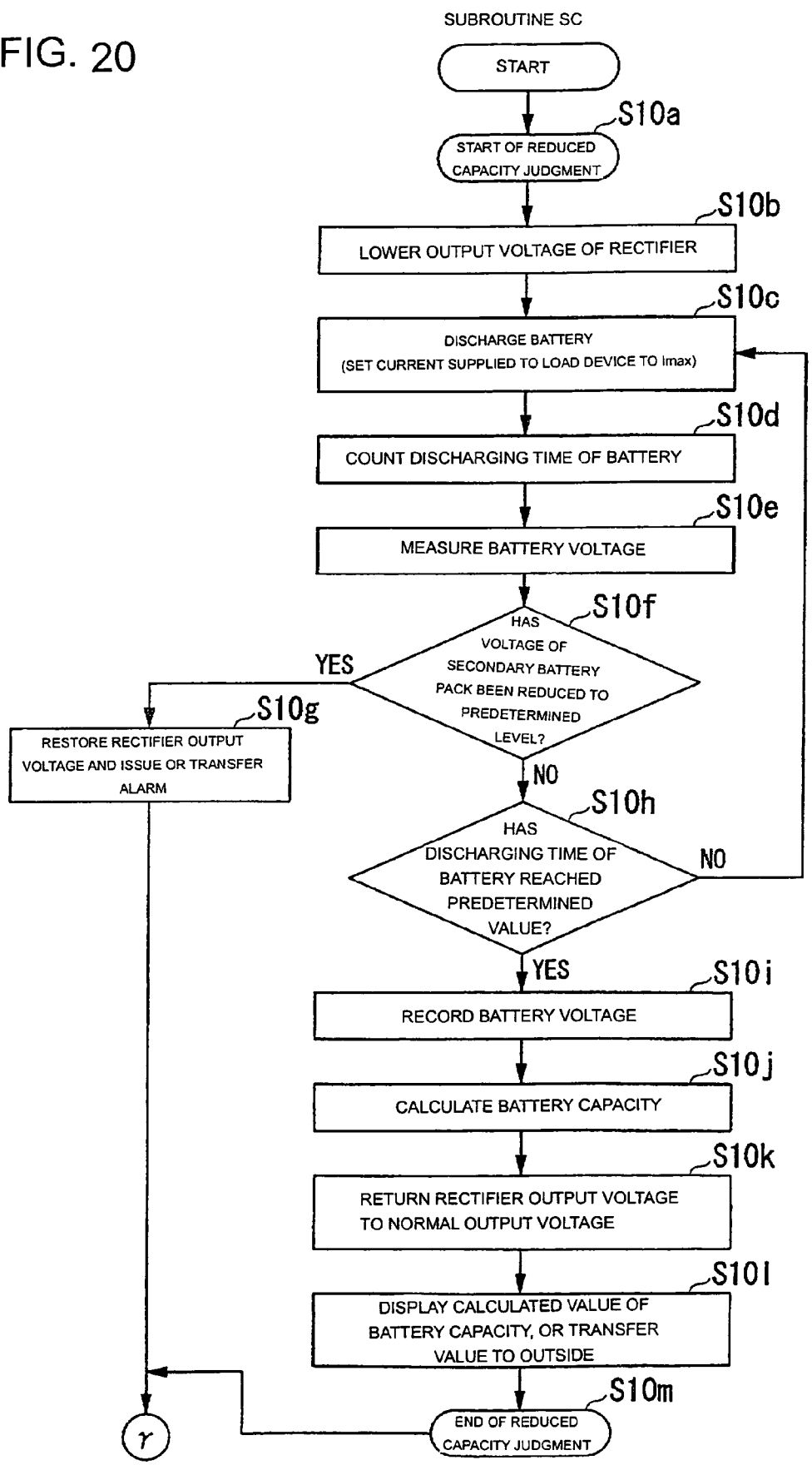
FIG. 20 is a flow chart showing an example of processing in the embodiment.

FIG. 20 is a flow chart showing the process of the subroutine SC.

The measurement-conditions input section 102 of the secondary-battery management apparatus 100 receives the user-input settings of the duration of reduced voltage output from the rectifier 200 (that is, the discharging period) and the discharging current. Then, the reduced-capacity judgment starts (step S10a).

The control section 103 outputs a rectifier output control signal to the rectifier 200 to decrease the output voltage of the rectifier 200 (step S10b). The battery pack 600 starts discharging in accordance with the voltage output from the rectifier 200. The control section 103 controls, if necessary, the current value of the load device 500 using a load control signal such that the sum of the current values of the load 400 and the load device 500 (the sum of the detection result of the load current sensor 800 and the detection result of the battery-pack charging-and-discharging current sensor 810 of the battery back) matches a predetermined constant current value (step S10c). In this case, the maximum current Imax calculated in step S02e (FIG. 16) is used as the constant current value.

The control section 103 starts counting the discharging time of the secondary battery from the time when the reduced-capacity judgment process starts (step S10d). The voltage sensor 830 measures the terminal voltage of the battery pack 600 (step S10e), and the control section 103 determines whether the voltage of the battery pack 600 is reduced to a predetermined level (step S10f). If the voltage of the battery pack 600 is reduced to the predetermined level (YES in step S10f), the voltage reduction of the rectifier 200 is cancelled, so that the voltage output from the rectifier 200 is returned to the normal voltage, and an alarm information is transferred to a terminal of the monitoring center (step S10g). The process then proceeds to step S02 shown in FIG. 15.

If the voltage of the battery pack 600 exceeds the predetermined level (NO in step S10f), it is determined whether the counted discharging time of the secondary battery reaches the discharging time input from the measurement-conditions input section 102 (step S10h). If the count value does not reach the input discharging time (NO in step S10h), the process proceeds to step S10c.

If the count value reaches the input discharging time (YES in step S10h), the terminal voltage of the battery is measured by the voltage sensor 830 at the discharging time, and the measured voltage value and the measurement result of the temperature sensor 820 are recorded (step S10i). When the measurement result of the temperature sensor 820 and the battery voltage are recorded, the arithmetic section 105 looks up battery data stored in the battery-data storage section 104 corresponding to the measured time and measured temperature, and calculates the capacity of the battery in accordance with the recorded battery voltage (step S10j).

The relationship between the battery capacity and the terminal voltage at a given elapsed discharging time, obtained from the discharge characteristics of the secondary batteries having different capacities (time-dependent terminal voltage characteristics), can be used in the calculation of the capacity of the battery. Accordingly, the relationship may be obtained at a given discharging current and a given ambient temperature. The relationship among the terminal voltage of the battery before being used (having a capacity of 100%), terminal voltage differences of batteries having different capacities after discharging, and the battery capacity can also be used to calculate the remaining capacity. The remaining capacity can also be calculated from the relationship among the charge voltage in floating charging, terminal voltage differences of batteries having different capacities after discharging, and the battery capacity. The battery data matching the condition is selected and looked up, depending on the measurement result of the temperature sensor 820 and the battery model input from the measurement-conditions input section 102.

After the battery capacity is calculated, the control section 103 changes back the output voltage of the rectifier 200 to the normal output voltage (step S10k) and outputs the value of the calculated battery capacity (step S10l). This output includes display at the display section 106 and transmission from the data transmission section 110 to a terminal of the external monitoring center. When the measurement result is output, the control section 103 ends the reduced-capacity judgment processing (step S10).

While the process is in progress, a power failure or a failure in the rectifier 200 is also detected. Once such a failure is detected, power is continuously supplied from the secondary battery to the load, and the capacity estimation process is suspended. After the power failure ends, the output voltage of the rectifier 200 is set to a normal value (value before the transition, that is, value before the step S10a), and power is supplied to the load and the secondary battery is charged.

Figure 22:
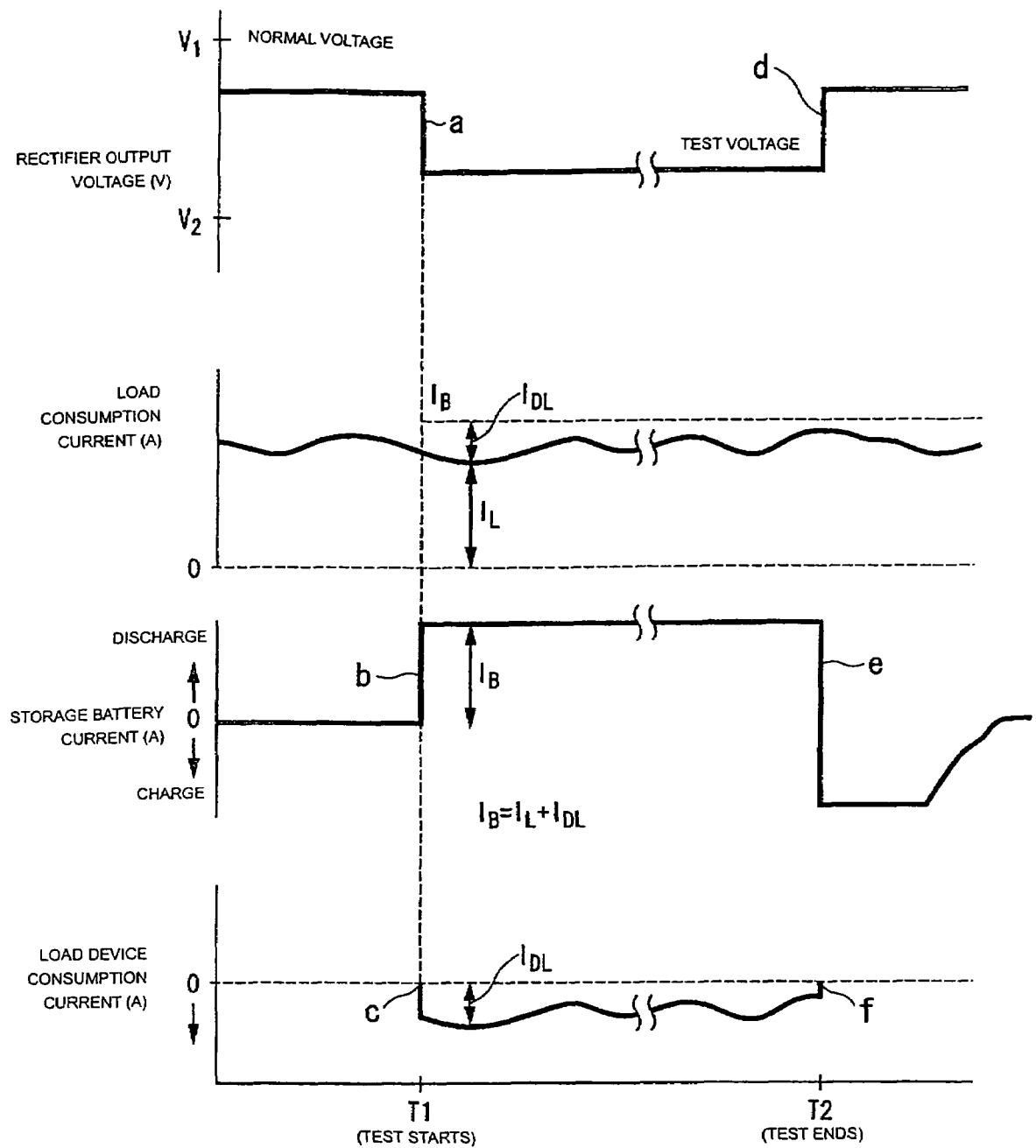
FIG. 22 a view illustrating an operation of a DC power supply apparatus with a secondary-battery management apparatus.

The operation of the DC power supply apparatus 1 with the secondary-battery remaining-capacity estimating function will be further described with reference to FIG. 22.

When a remaining-battery-capacity estimating test is started at time T1, the output voltage of the rectifier 200 is reduced (indicated by "a") according to a command from the control section 103. When the output voltage decreases, electrical power is supplied from the battery pack 600, and thereby, an electrical current flows therefrom (indicated by "b"), resulting in a load device consumption current (indicated by "c"). Thereafter, when the test is completed at time T2 after a specified discharging time elapses, the output voltage of the rectifier 200 is returned to the normal voltage (indicated by "d") to start charging the battery pack 600 (indicated by "e") based on a command from the control section 103. Subsequently, when the circuit disconnection switch 700 of the load device 500 is turned off, it causes the load consumption current to become zero (indicated by "f"). In this figure, an equation (secondary-battery discharging current IB)=(load current $I_{DL}$)+(load current $I_L$" holds).

Figure 23:
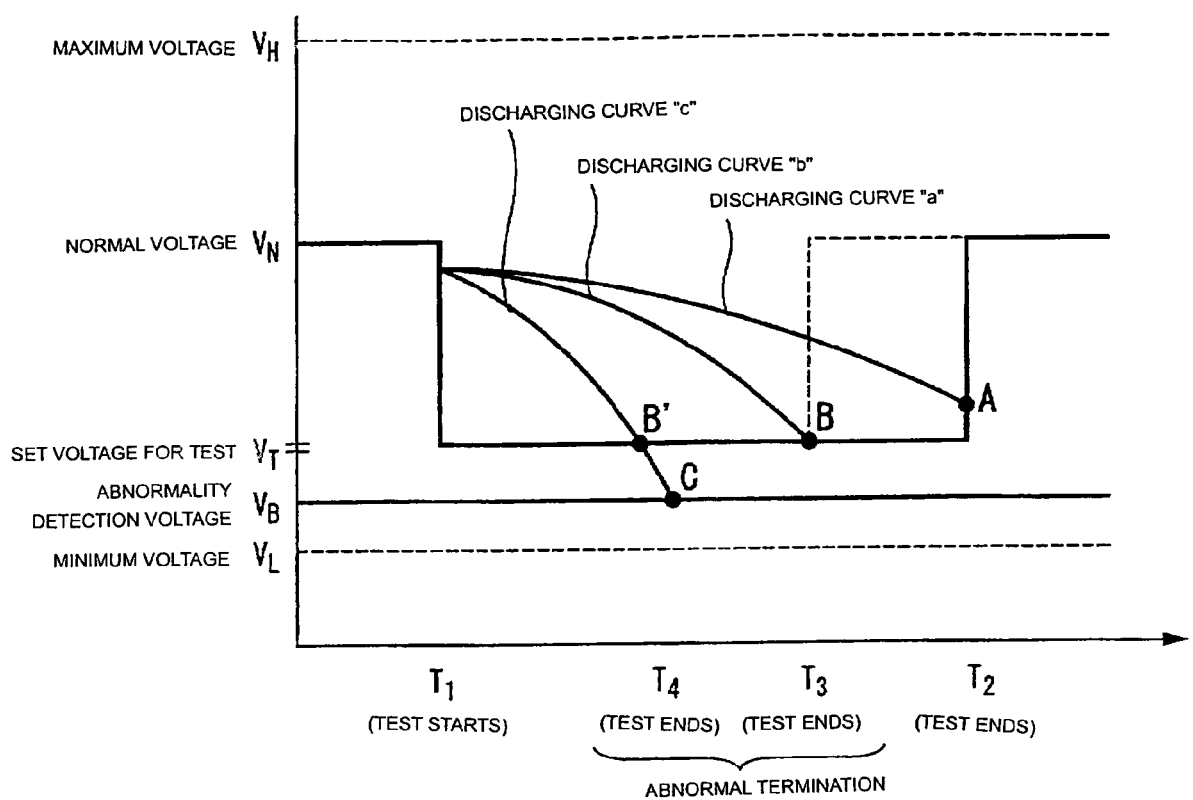
FIG. 23 is a graph illustrating the relationship between the discharge voltage of a secondary battery and set voltages in a discharge test.

Furthermore, the relationships between set voltages and the discharge voltage of the secondary battery during a discharge test will be described with reference to FIG. 23.

The figure shows the upper and lower limits of the power supply voltage in a DC power supply system, a normal operating voltage VN of the rectifier 200, and a voltage VT of the rectifier 200 during the test. The voltage VT of the rectifier 200 during the test is set to a value higher than the lower-limit voltage of the system. When the test starts, the output voltage of the rectifier 200 is set to the test voltage VT, and the secondary battery starts discharging at the same time. In the case of a normal storage battery whose remaining capacity is not extremely low, the voltage changes over time along a discharging curve indicated by "a", and the test ends at predetermined time T2. In case of a battery having a low remaining capacity, discharge proceeds along a discharging curve indicated by "b", and the test is completed in a shorter period of time (at point B) than the set discharging time. Since the voltage of the secondary battery becomes the same as the output voltage of the rectifier 200 at point B, discharge of the secondary battery only cannot be performed, and in practice, therefore, the test ends. When the control section 103 detects this state, remaining-battery-capacity estimation is performed at a stage before this time T3, and the voltage reduction of the rectifier 200 is discontinued to return to the normal voltage VN. An abnormality detection voltage VB is set to protect the system so as not to cause any problem even if the control section 103 overlooks this state upon reaching point B. This case is illustrated by a discharging curve indicated by "c". More specifically, when the control section 103 fails to detect the end of the test at point B', discharge proceeds further. When the voltage decreases to the minimum voltage VL of the system, there is a risk of damaging the load. To overcome this problem, the abnormality detection voltage VB is set to terminate the test if the output from the system decreases to this voltage. Processes such as canceling the output reduction of the rectifier 200 and issuing an alarm are performed.

The calculation for the remaining-battery-capacity estimation can be carried out two or more times, instead of just once, within the maximum discharging time set when the test is started. The test can be terminated when the calculated value reaches a target precision through several estimations in this way even before the set discharging time is reached. On the other hand, when the calculated value does not have the target precision, discharging is continued, and after the set discharging time for remaining capacity estimation is reached, and then the test is ended.

According to the embodiment described above, the control section 103 changes back the output voltage of the rectifier 200 to an appropriate value after the remaining battery capacity is calculated. Because of this, the rectifier 200 not only supplies power to the load but also charges the secondary battery, thereby preventing the quality of electrical power supplied to the load from deteriorating.

Furthermore, according to this embodiment, when a battery voltage of the battery pack 600 decreases to the predetermined value, the control section 103 changes back the output voltage of the rectifier 200 to the normal value. Therefore, the secondary battery can be prevented from being fully discharged in case of an emergency such as a power failure after the discharge test is ended. In addition, since some detection voltages are set, it is possible to prevent a problem in the system, caused by the test.

Next, the battery data stored in the battery-data storage section 104 in preparation for estimation of the remaining capacity according to the embodiment described above will be described. More specifically, the characteristics obtained from the relationship shown in FIG. 3 will be used. In FIG. 3, Vcn(Tn) means a terminal voltage of the battery having a remaining capacity Cn when the battery is discharged and a discharging time Tn has elapsed. In other words, this figure shows the relationships between remaining capacities and terminal voltages of the battery at various elapsed times, for each battery model and each discharging current. In FIG. 3, $V_{100}$(Tn) represents the terminal voltage of the battery in the initial state, $V_{80}$(Tn) represents the terminal voltage of the battery having a remaining capacity of 80%, and $V_{60}$(Tn) represents the terminal voltage of the battery having a remaining capacity of 60%, after discharging time Tn has elapsed. In this figure, the voltage difference ΔV between the terminal voltage $V_{100}$(Tn) of the battery in the initial state and the terminal voltage $V_{60}$(Tn) of the battery having a reduced remaining capacity after the discharging time Tn has elapsed is indicated by an arrow "b". The difference from the floating charge voltage is indicated by "c".

The relationship between the elapsed discharging time and the terminal voltage during discharging of the battery having a reduced remaining capacity can be obtained by using these discharge characteristics. The relationship is shown in FIG. 4. The terminal voltage after the specified discharging time has elapsed can be measured and the remaining capacity can be estimated, in accordance with the relationship predetermined by each discharging current.

The estimation can also be made from the difference between the terminal voltage of the battery having a capacity of 100% and the terminal voltage of the battery having a reduced capacity after a given discharging time has elapsed. Information indicating the relationship between the remaining capacity and the voltage difference ΔV' (indicated by "c" in FIG. 3) between the floating charge voltage $V_{float}$ of the battery and the terminal voltage of the battery having a reduced capacity at each discharging time may also be used. The relationships between the voltage difference and the capacity based on these two parameters are shown in FIG. 5.

The battery data obtained in this way is stored in the battery-data storage section 104. An example of the stored battery data is shown in FIG. 5. The battery data is created for each battery model. Since in the actual power supply system, the battery charge is maintained by a charger such as a rectifier, it is practical to have a relationship with the charge voltage in floating charging.

Referring Back to FIG. 15, if it is judged in step S09 shown in FIG. 15 that it is not a good time to discharge the battery due to a reduction in output from the rectifier (NO in step S09), the control section 103 of the secondary-battery management apparatus 100 judges whether a battery capacity test should be carried out by using the load current pattern (step S11). The time at which the battery capacity test should be carried out by using the load current pattern is determined by using the data specified in step S01. If it is not a good time to perform the battery capacity check by using the load current pattern (NO in step S11), the process proceeds to step S02.

If the battery capacity check should be carried out by using the load current pattern (YES in step S11), the process of a subroutine SD (FIG. 21) is performed (step S12).

Figure 21:
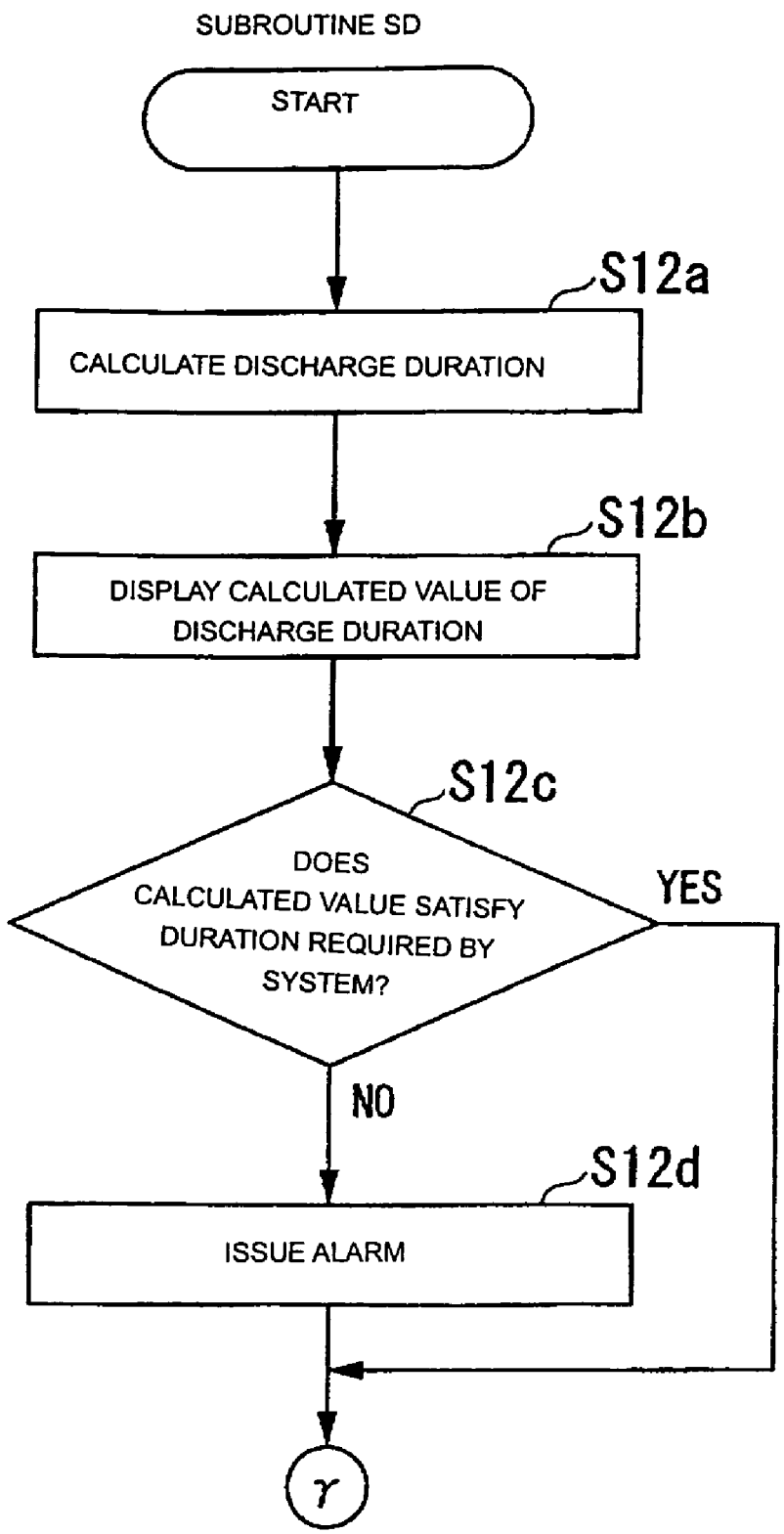
FIG. 21 is a flow chart showing an example of processing in the embodiment.

FIG. 21 is a flow chart showing the process of the subroutine SD. A possible discharge duration after a hypothetically set time at which power failure occurs is calculated in accordance with the load current pattern created in step S02d (FIG. 16). The calculated possible discharge duration is displayed on the display section 106 (step S12b), and it is judged (step S12c) whether the possible discharge duration calculated in step S12a is longer than the discharge duration (necessary discharging time) input in step S01 (FIG. 15). In other words, it is determined whether the calculated discharge duration satisfies the duration required by the system.

If the possible discharge duration calculated in step S12a is shorter than the discharge duration input beforehand in step S01 (NO in step S12c), an alarm is issued (step S12d), and the process proceeds to step S02 (FIG. 15). If the possible discharge duration calculated in step S12a is longer than the discharge duration input beforehand in step S01 (YES in step S12c), the processing proceeds to step S02.

Figure 24:
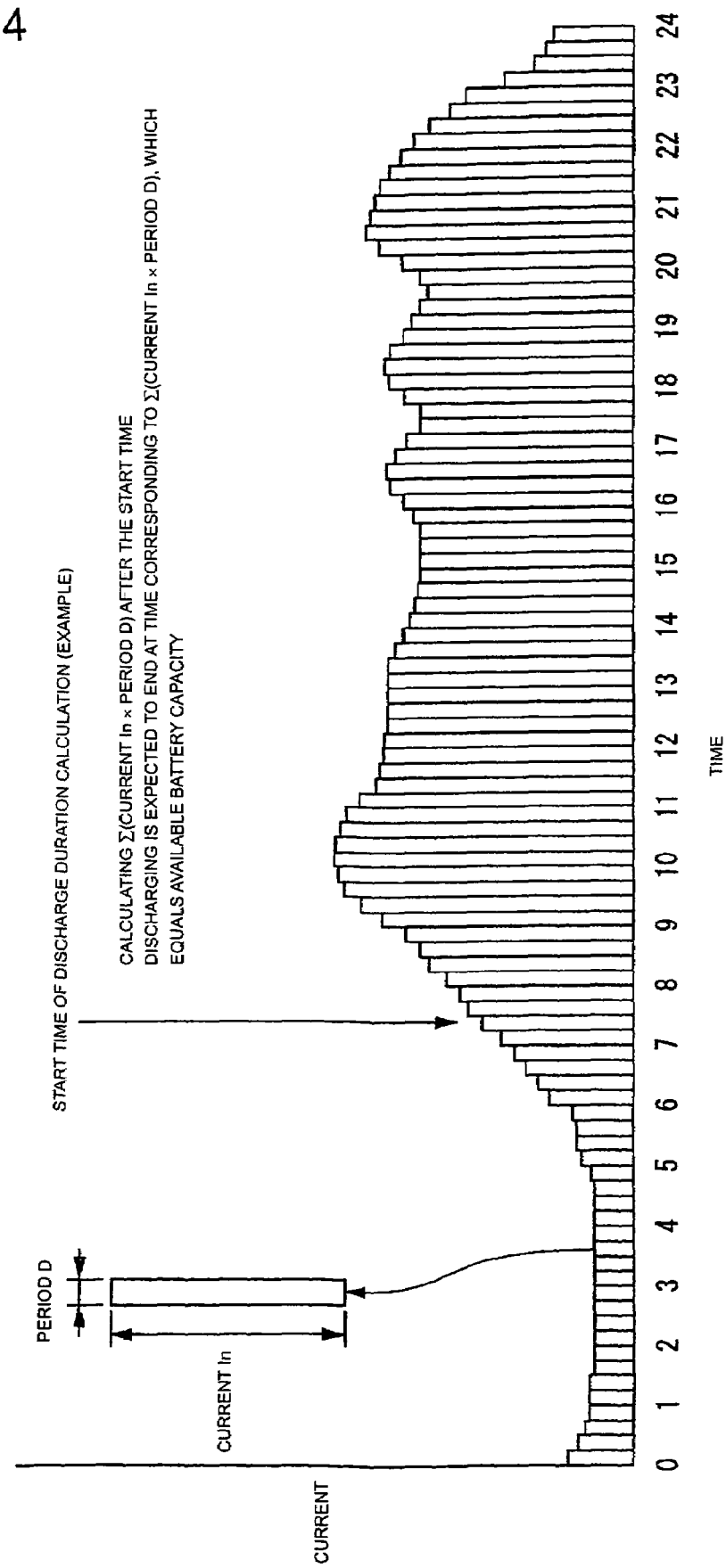
FIG. 24 is a graph showing an example of a load-current pattern stored in a battery-data storage section in the embodiment.

In step S12c shown in FIG. 21, it is determined by the following method whether the possible discharge duration calculated in step S12a is longer than the discharge duration input beforehand in step S01. The battery-data storage section 104 of the secondary-battery management apparatus 100 stores the load current pattern representing the time-current relationship, such as that shown in FIG. 24. The load current pattern is created in step S02d shown in FIG. 16. The possible discharge duration after the start of the discharge duration calculation is obtained in accordance with the load current pattern. If the obtained value is greater than the discharge duration input beforehand in step S01, it is determined in step S12a that the calculated possible discharge duration is longer.

In the above description, the possible discharge duration after the hypothetically set time at which power failure occurs is calculated as the time required to reduce the remaining capacity of the secondary battery to zero by successively subtracting the product of the short period D and the discharging current In from the capacity (or dischargeable capacity) of the battery. It is assumed that discharging is performed along a measured load current, and the duration is calculated as the time required to reduce the capacity of the secondary battery to zero by subtracting the amount of electricity after discharging starts (the product of current and time, or the sum of the amounts of electricity obtained in different current steps if the current varies), as indicated by equation 7 given below:

$$T = C - \sum_{i=1}^{n} Ii \times Td \qquad (7)$$

where T represents the possible discharge duration, Td represents a divided unit time, Ii represents the load current in each Td, and C represents the capacity of the secondary battery (or dischargeable capacity). Equation 8 below gives C:

$$C = \sum_{i=1}^{n} Ii \times Ti \qquad (8)$$

If the duration of the load current pattern is divided into a certain number of time units, up to n time units satisfying equation 7 are obtained. A load current pattern of each day of the week may be obtained by averaging the data for consecutive several days. A second characteristic is the above-described method, in which the amount of electricity obtained by multiplying current by time is successively subtracted from the capacity of the secondary battery to obtain the possible discharge duration. In the initial calculation of battery capacity, a certain duration should be ensured at an assumed load current. Actually, an increase in load current makes it hard to ensure the duration. If this is detected from the calculation indicated above, an alarm is issued.

A suitable criterion for issuing an alarm would be 70% or 80% of the initially specified duration. The reason is that one of these values is used as a criterion for determining whether to change the battery because the battery is degraded and the capacity is reduced. When the battery capacity is reduced to 70% or 80%, the duration is assumed to be reduced to 70% or 80% of the initial design value, even if the initial load does not change. However, any desired value can be specified.

Figure 25:
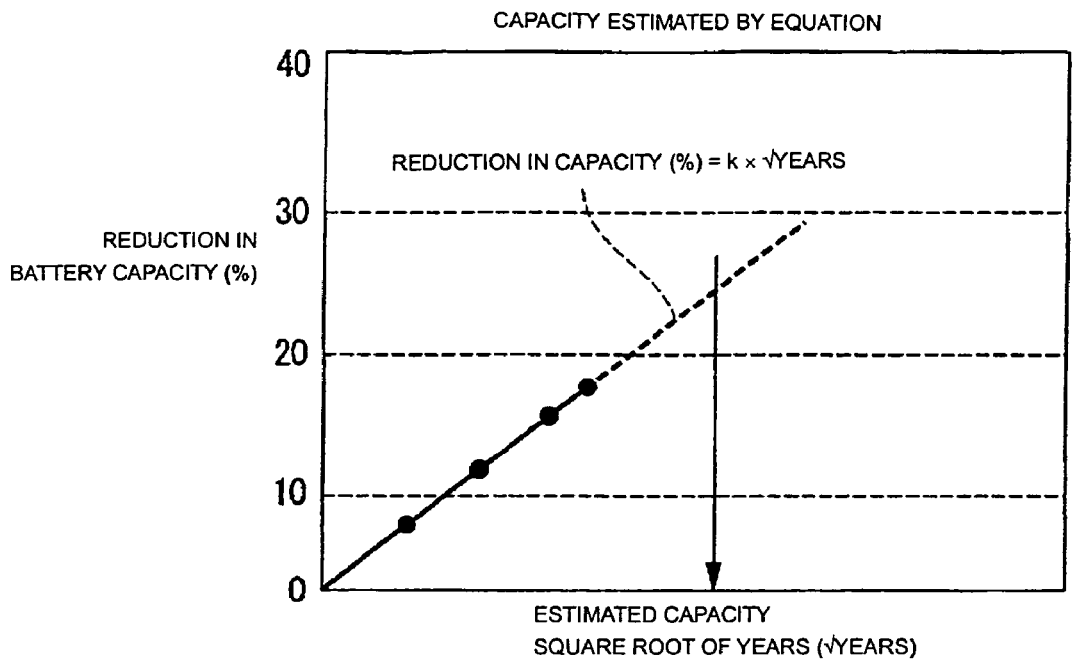
FIG. 25 is a graph for estimating a capacity from an estimating equation.

The battery capacity decreases with the passage of time after installation, as shown in FIG. 8. In this embodiment, the remaining capacity of the battery is calculated by taking its change over time into consideration. Because the reduction of the capacity with the passage of time is proportional to the square root of the period of use, the capacity can be calculated from the estimating equation shown in FIG. 25 or can be obtained by extrapolation of FIG. 8.

The remaining capacity of the battery obtained from the difference between the terminal voltage and the floating charge voltage in the course of periodic discharging of the secondary battery can also be used as the battery capacity at that time. Because the battery capacity also varies depending on temperature, the capacity obtained as described above is corrected in accordance with the temperature. The temperature dependence relationship shown in FIG. 9 is used for the temperature correction. Based on the capacity obtained in that way, the possible discharge duration is obtained from the load current pattern. If the monitoring center has a function to judge the reduction of capacity of the secondary battery according to the present embodiment, intervals between current measurement and the calculation of the possible discharge duration may be specified in advance.

Figure 26:
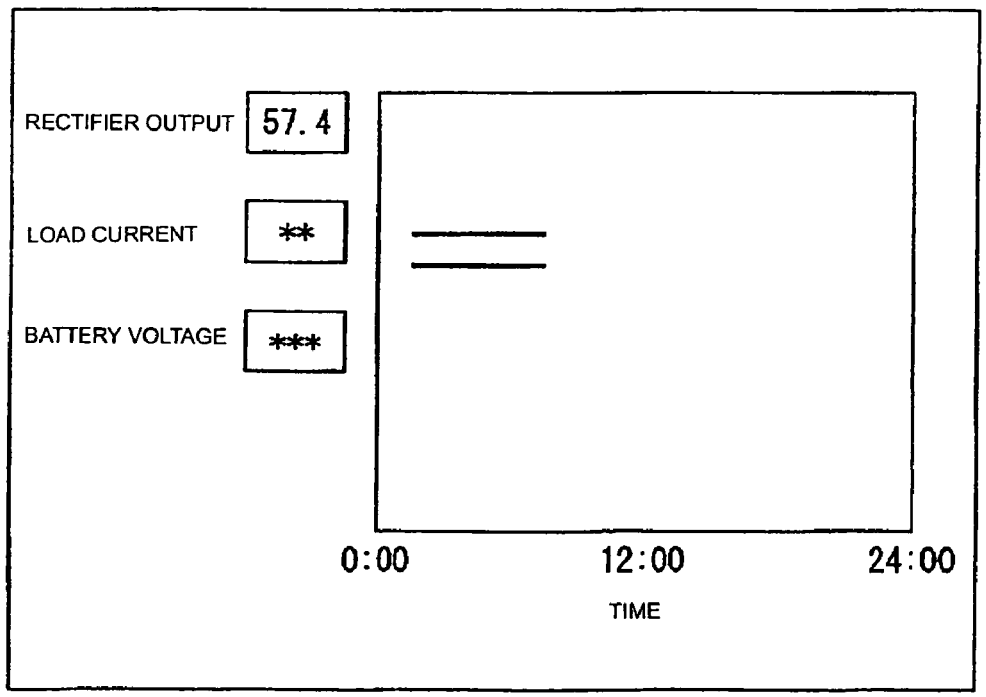
FIG. 26 is a view showing an example of an image displayed on a display section of a secondary-battery management apparatus of the embodiment.
Figure 27:
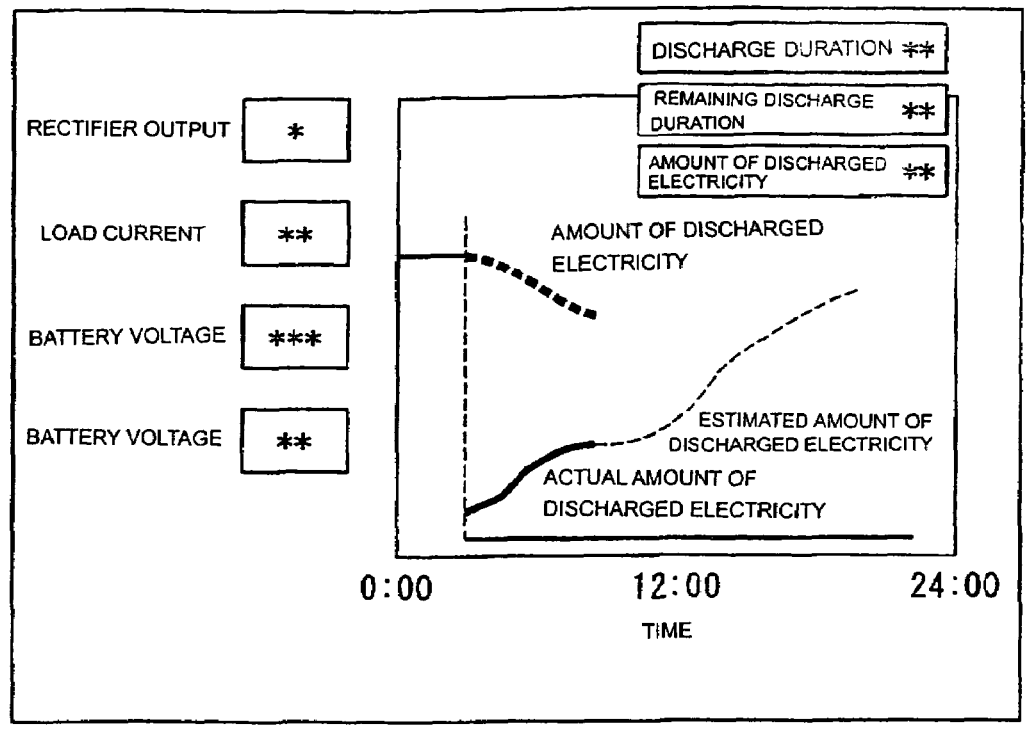
FIG. 27 is a view showing another example of an image displayed on a display section of a secondary-battery management apparatus of the embodiment.
Figure 28:
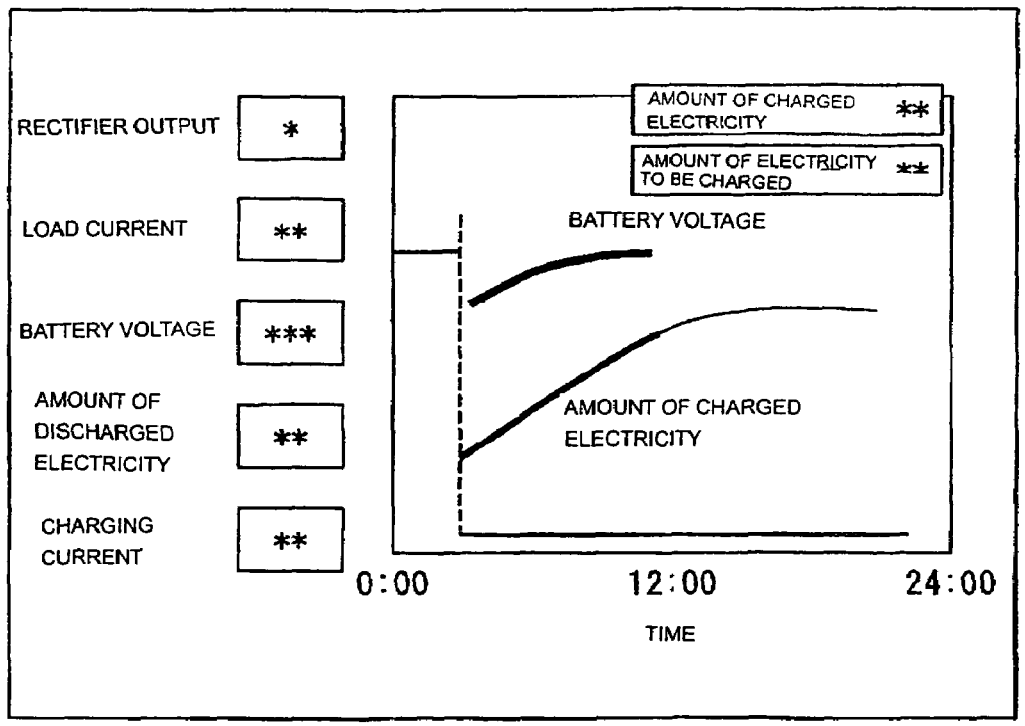
FIG. 28 is a view showing a further example of an image displayed on a display section of the secondary-battery management apparatus of the embodiment.

FIGS. 26 to 28 show sample images displayed on the display section 106 of the secondary-battery management apparatus 100 of the embodiment. FIG. 26 shows an image displayed on the display section 106 when the secondary-battery management apparatus 100 is in the standby state, as in steps S02 to S11 in FIG. 15. FIG. 27 shows an image displayed on the display section 106 of the secondary-battery management apparatus 100 when the secondary battery is in a discharging state, as in steps S08a to S08g in FIG. 17. FIG. 28 shows an image displayed on the display section 106 of the secondary-battery management apparatus 100 when the secondary battery is in a charging state, as in steps S08h to S08q in FIGS. 17 and 18.

In the embodiment described above, DC power is supplied to the load 400, but the battery management apparatus can be applied to an AC power supply system as well as the DC power supply system.

Figure 29:
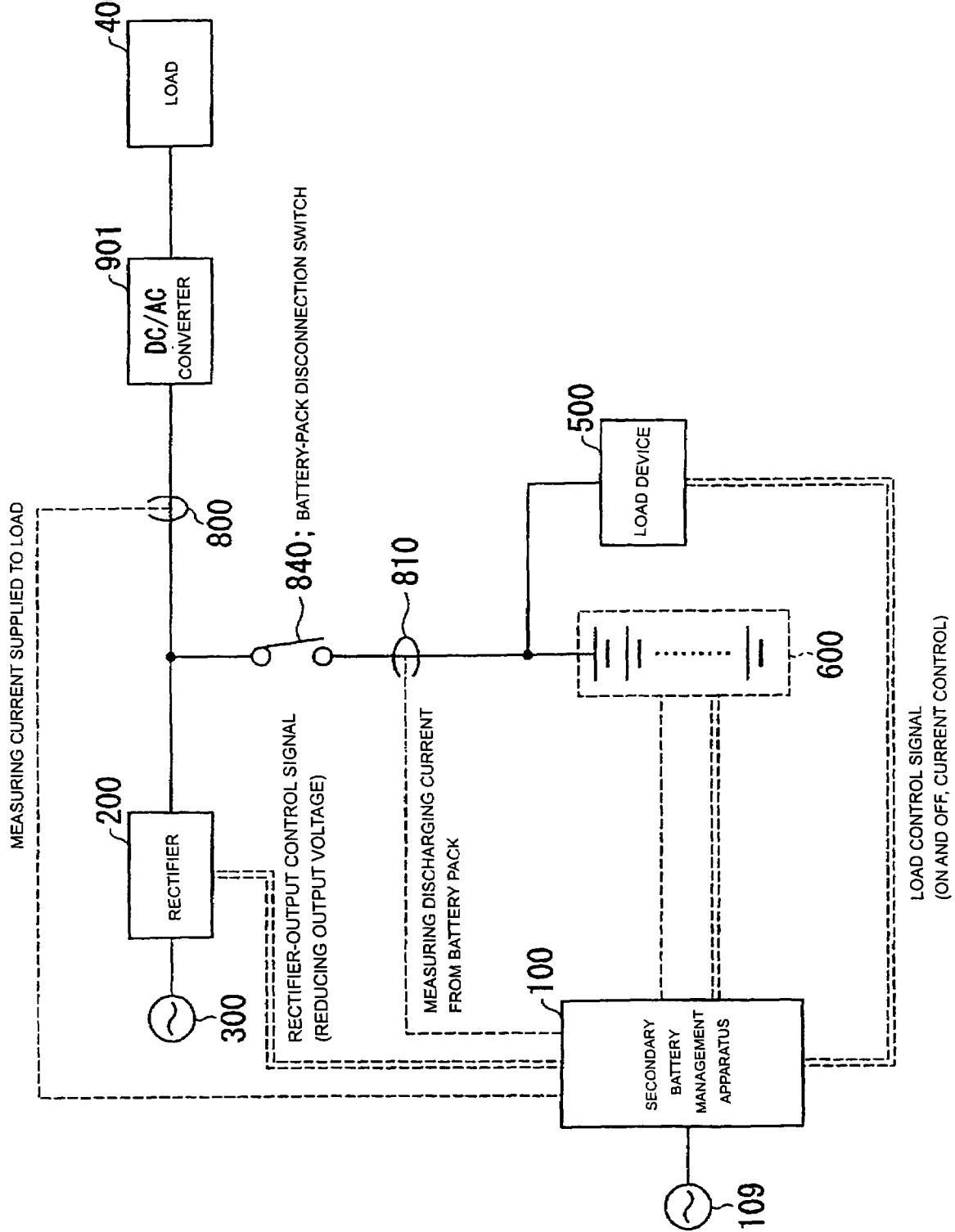
FIG. 29 is an outlined block diagram showing an example of application of the secondary-battery management apparatus to an AC power supply apparatus.

FIGS. 29 and 30 are schematic block diagrams showing examples of applications of the battery management apparatus in AC power supply systems. In the AC power supply systems including a special charger 900 for a backup secondary battery, a DC-AC converter 901, and a voltage regulator 902, shown in FIGS. 29 and 30, the special charger 900 adjusts the charge voltage in place of the rectifier 200 in the DC power supply system. Although the secondary battery discharges through a special load device 500 instead of a load 400, the capacity of the secondary battery is estimated from its constant-current discharging in the same way. To prevent overdischarge during test discharging or the like from affecting the load 400, it is possible to measure the total voltage of a battery pack 600, and if the total voltage decreases to a voltage value specified beforehand for predicting danger, discharging of the secondary battery is stopped.

An advantage of the embodiment described above is that when the lithium-ion battery is used as the backup battery, the battery status of the lithium-ion battery, such as the remaining serviceable period, the amount of remaining electricity, the discharge duration during which discharge of the secondary battery is carried out, and the charging ratio while recharging is in progress, can be comprehensively obtained, and repair and maintenance can be performed accordingly as required.

Applications of the secondary-battery management apparatus 100 according to the embodiment to a battery charging apparatus is advantageous in that the reliability of a power supply system utilizing a lithium-ion battery can be greatly improved.

Even if there is a possibility that due to changes in load current, initial duration cannot be maintained thereby causing a maintenance problem after the battery is installed, according to the embodiment described above, there is no problem will occur concerning maintenance. That is, the possible discharge duration (battery capacity) can be calculated by measuring the load current periodically and checking whether a required backup period is ensured. If the possible discharge duration is insufficient, an alarm is issued. Accordingly, the battery and the load can be always maintained in an appropriate relationship, and a highly-reliable power supply system can be provided.

In the embodiment described above, a program for implementing the functions of the data input section 101, the measurement-conditions input section 102, the control section 103, the battery-data storage section 104, the arithmetic section 105, the display section 106, the power supply section 107, and the data transmission section 110 in FIG. 2, or some of those functions, can be recorded in a computer-readable recording medium, and the secondary-battery management apparatus 100 can be controlled by reading the program from the recording medium into a computer system and executing the program in the computer system. The computer system here includes an operating system (OS) and hardware such as peripherals and the like.

The computer-readable recording medium means a transportable medium such as a flexible disk, a magneto optical disk, a ROM, or a CD-ROM, or a storage device such as an internal hard disk drive of the computer system. The optical disk, a ROM, or a CD-ROM, or a storage device such as an internal hard disk drive of the computer system. The computer-readable recording medium also means a medium holding the program dynamically for a short period of time, such as a communication line when the program is sent through a network such as the Internet or a communication channel such as a telephone channel, or a device which holds the program for a certain period of time, such as a volatile memory in the computer system, used as a server or a client. The program may implement some of the functions described above and may also implement the functions described above in combination with a program already recorded in the computer system.

According to the embodiments, the secondary-battery management apparatus calculates the remaining capacity and the remaining lifetime of the secondary battery from the measured value of temperature in the standby state, in which the secondary battery, such as the lithium-ion battery, is not charging or discharging; calculates the remaining capacity of the secondary battery from the measured discharging current in the discharging state; and calculates the remaining capacity of the secondary battery from the measured charging current in the charging state, so that the battery status of the secondary battery, such as the remaining lifetime and the remaining capacity, can be comprehensively checked. This provides such a significant advantage in secondary-battery management that maintenance of the secondary battery can be performed only as required.

According to the embodiments, because the load device is provided, the discharging current from the battery can be kept constant, and the discharge voltage characteristics can be obtained with high precision.

According to the embodiments, while the battery is supplying power to the load and the load device, the reduction in voltage by the rectifier 200 is cancelled if the voltage of the battery falls to or below a predetermined level. Accordingly, the remaining capacity of the battery will not be reduced to such a low level that the load cannot be driven, even under circumstances where the battery should discharge after the processing to judge the reduced capacity of the battery is finished.

According to the embodiments, the load current in the power supply system equipped with the secondary battery as a backup power supply can be measured, and the discharge duration can be calculated in accordance with the load current and the measurement time. Accordingly, even if the load current value changes from the initial design value of the power supply system, the possible discharge duration of the secondary battery can be accurately calculated.

According to the embodiments, the possible discharge duration of the secondary battery can be corrected in accordance with changes of the battery over time. Accordingly, the possible discharge duration of the secondary battery can be calculated more accurately.

According to the embodiments, a warning means can issue an alarm if it is judged that discharging for the discharge duration is impossible. An advance alarm can be issued even if the load current increases more than expected, making it impossible to ensure the desired discharge duration.

As has been described above, if the management apparatus is applied to an apparatus for charging a lithium-ion battery, the reliability of a power supply system using the lithium-ion battery can be greatly improved, resulting in a very significant industrial advantage.

According to the embodiments, the possible discharge duration can be corrected in accordance with the ambient temperature. Accordingly, the possible discharge duration of the secondary battery can be calculated more accurately.

The preceding description has been presented only to illustrate and describe exemplary embodiments of the present apparatus, method, and program according to the present invention. It is not intended to be exhaustive or to limit the invention to any precise form disclosed. It will be understood by those skilled in the art that various changes may be made and equivalents may be substituted for elements thereof without departing from the scope of the invention. In addition, many modifications may be made to adapt a particular situation or material to the teachings of the invention without departing from the essential scope. Therefore, it is intended that the invention not be limited to the particular embodiment disclosed as the best mode contemplated for carrying out this invention, but that the invention will include all embodiments falling within the scope of the claims. The invention may be practiced otherwise than is specifically explained and illustrated without departing from its spirit or scope.

What is claimed is:

1. A secondary-battery management apparatus in a power supply system which includes a secondary battery as a backup power supply and supplies power to a load, the secondary-battery management apparatus comprising:
    a load device provided separately from the load and connected in parallel to the load;
    a battery-data storage section for storing a load current pattern of current flowing through the load and a maximum current, which is the maximum value of current flowing through the load;
    a measurement-conditions input section for obtaining discharge timing to discharge the secondary battery by reducing an output of a rectifier, and checking timing to check the capacity of the secondary battery by using the load current pattern;
    an arithmetic section for calculating a remaining capacity and a remaining lifetime of the secondary battery in accordance with information on a temperature of the secondary battery in a standby state, in which the secondary battery is not being charged nor discharged, for calculating the remaining capacity of the secondary battery in accordance with information on a measured discharging current from the secondary battery while the secondary battery is in a discharging state, and for calculating the remaining capacity of the secondary battery in accordance with information on a measured charging current to the secondary battery while the secondary battery is in a charging state;
    a first control section for judging the reduced capacity of the secondary battery by supplying the load current stored in the battery-data storage section to the load device at the discharge timing to discharge the secondary battery by reducing the output of the rectifier; and
    a second control section for calculating the discharge duration of the secondary battery by using the load current pattern stored in the battery-data storage section at the checking timing to check the battery capacity by using the load current pattern.

2. A secondary-battery management apparatus according to claim 1, further comprising:
    a temperature measurement section for measuring the temperature of the secondary battery;
    a voltage measurement section for measuring a voltage of the secondary battery; and
    a third control section for stopping charging or discharging of the secondary battery when the temperature measured by the temperature measurement section exceeds a predetermined level or when the voltage measured by the voltage measurement section exceeds a predetermined level.

3. A secondary-battery management apparatus according to claim 1, further comprising:
    a first correction means for correcting the possible discharge duration of the secondary battery in accordance with changes of the secondary battery after usage.

4. A secondary-battery management apparatus according to claim 2, further comprising:
    a first correction means for correcting the possible discharge duration of the secondary battery in accordance with changes of the secondary battery after usage.

5. A secondary-battery management apparatus according to claim 1, further comprising:
    a second correction means for correcting the possible discharge duration in accordance with an ambient temperature of the secondary battery.

6. A secondary-battery management apparatus according to claim 2, further comprising:
    a second correction means for correcting the possible discharge duration in accordance with an ambient temperature of the secondary battery.

7. A secondary-battery management apparatus according to claim 3, further comprising:
    a second correction means for correcting the possible discharge duration in accordance with an ambient temperature of the secondary battery.

8. A secondary-battery management apparatus according to claim 4, further comprising:
    a second correction means for correcting the possible discharge duration in accordance with an ambient temperature of the secondary battery.

9. A secondary-battery management apparatus according to one of claims 1 to 8, further comprising:
    an alarm output means for outputting an alarm when the possible discharging time of the secondary battery is shorter than a predetermined period.

10. A secondary-battery management method for managing a secondary battery, comprising the steps of:
    storing a load current pattern of current flowing through a load and a maximum current flowing through the load;
    obtaining discharging timing to discharge the secondary battery by reducing an output of a rectifier and checking timing to check a secondary battery capacity by using the load current pattern;
    calculating a remaining capacity and a remaining lifetime of the secondary battery in accordance with information on a temperature of the secondary battery in a standby state, in which the secondary battery is not being charged or discharged, calculating the remaining capacity of the secondary battery in accordance with information on a discharging current from the secondary battery while the secondary battery is in a discharging state, and calculating the remaining capacity of the secondary battery in accordance with information on a charging current to the secondary battery while the secondary battery is in a charging state;

judging the reduced capacity of the secondary battery by supplying the load current to a load device at the discharge timing to discharge the secondary battery by reducing the output of the rectifier; and calculating the discharge duration of the secondary battery by using the load current pattern at the checking timing to check the capacity of the secondary battery by using the load current pattern.

11. A secondary-battery management method according to claim 10, further comprising the steps of:

measuring the temperature of the secondary battery;

measuring the voltage of the secondary battery; and stopping the charging or discharging of the secondary battery when the temperature exceeds a predetermined level or when the voltage exceeds a predetermined level.

12. A secondary-battery management method according to claim 10, further comprising the step of:

correcting the possible discharge duration of the secondary battery in accordance with a change of the secondary battery after usage.

13. A secondary-battery management method according to claim 11, further comprising the step of:

correcting the possible discharge duration of the secondary battery in accordance with a change of the secondary battery after usage.

14. A secondary-battery management method according to claim 10, further comprising the step of:

correcting the possible discharge duration in accordance with an ambient temperature of the secondary battery.

15. A secondary-battery management method according to claim 11, further comprising the step of:

correcting the possible discharge duration in accordance with an ambient temperature of the secondary battery.

16. A secondary-battery management method according to claim 12, further comprising the step of:

correcting the possible discharge duration in accordance with an ambient temperature of the secondary battery.

17. A secondary-battery management method according to claim 13, further comprising the step of:

correcting the possible discharge duration in accordance with an ambient temperature of the secondary battery.

18. A secondary-battery management method according to one of claims 10 to 17, further comprising the step of:

outputting an alarm when the possible discharging time of the secondary battery is shorter than a predetermined period.

19. A computer program product, said computer program product stored on a computer readable medium and including a program code for causing a computer in the secondary-battery management apparatus according to claim 1 to execute:

a first step of storing a load current pattern of current flowing through a load and a maximum current, which is the maximum value of current flowing through the load;

a second step of obtaining discharge timing to discharge the secondary battery by reducing an output of a rectifier and checking time to check the capacity of the secondary battery by using the load current pattern;

a third step of calculating a remaining capacity and a remaining lifetime of the secondary battery in accordance with information on a temperature of the secondary battery in a standby state, in which the secondary battery is not being charged or discharged, calculating the remaining capacity of the secondary battery in accordance with information on a discharging current from the secondary battery while the secondary battery is in a discharging state, and calculating the remaining capacity of the secondary battery in accordance with information on a charging current to the secondary battery while the secondary battery is in a charging state;

a fourth step of judging the reduced capacity of the secondary battery by supplying the load current to a load device at the discharging timing to discharge the secondary battery by reducing the output of the rectifier; and a fifth step of calculating the discharge duration of the secondary battery by using the load current pattern at the checking timing to check the secondary battery capacity by using the load current pattern.

* * * * *